US009160270B2

(12) United States Patent
Miura

(10) Patent No.: US 9,160,270 B2
(45) Date of Patent: Oct. 13, 2015

(54) OPERATIONAL AMPLIFIER, MOTOR DRIVE DEVICE, MAGNETIC DISK STORAGE DEVICE, AND ELECTRONIC APPLIANCE

(71) Applicant: ROHM CO., LTD., Kyoto (JP)

(72) Inventor: Shinichi Miura, Kyoto (JP)

(73) Assignee: ROHM CO., LTD. (JP)

( * ) Notice: Subject to any disclaimer, the term of this patent is extended or adjusted under 35 U.S.C. 154(b) by 56 days.

(21) Appl. No.: 13/894,861

(22) Filed: May 15, 2013

(65) Prior Publication Data

US 2014/0340789 A1   Nov. 20, 2014

(51) Int. Cl.
 G11B 5/00 (2006.01)
 G11B 19/20 (2006.01)
 H02P 25/02 (2006.01)
 G11B 20/10 (2006.01)
 G11B 19/28 (2006.01)
 H03F 3/45 (2006.01)

(52) U.S. Cl.
 CPC .............. *H02P 25/028* (2013.01); *G11B 19/28* (2013.01); *G11B 20/10037* (2013.01); *H03F 3/45183* (2013.01)

(58) Field of Classification Search
 CPC ... H03F 3/45479; H02P 25/028; G11B 19/20; G11B 20/10037; G11B 5/59627
 USPC .................... 360/46, 67, 98.07, 99.04, 99.08; 388/910
 See application file for complete search history.

(56) References Cited

U.S. PATENT DOCUMENTS

| 5,392,172 | A * | 2/1995 | Yoshinaga et al. ............... 360/67 |
| 6,703,893 | B1 * | 3/2004 | Isham ............................ 327/538 |
| 6,900,959 | B1 * | 5/2005 | Gardner et al. ............. 360/78.04 |
| 7,227,321 | B1 * | 6/2007 | Hoo et al. ................ 318/400.34 |
| 7,521,992 | B1 * | 4/2009 | Hagleitner et al. ........... 327/563 |
| 2004/0004507 | A1 * | 1/2004 | Fujiyama et al. ............. 327/307 |
| 2007/0001632 | A1 * | 1/2007 | Daio ............................. 318/254 |
| 2007/0013439 | A1 * | 1/2007 | Gutzki et al. ...................... 330/9 |
| 2007/0296481 | A1 | 12/2007 | Hayakawa |
| 2009/0153086 | A1 * | 6/2009 | Narumi et al. ........... 318/400.35 |

FOREIGN PATENT DOCUMENTS

| JP | 2002-63773 A | 2/2002 |
| JP | 2008-4156 A | 1/2008 |
| JP | 2009-33861 A | 2/2009 |

* cited by examiner

*Primary Examiner* — Thomas Alunkal
(74) *Attorney, Agent, or Firm* — Cantor Colburn LLP

(57) ABSTRACT

An operational amplifier has an input stage which generates a first input current and a second input current in accordance with a first input signal and a second input signal, an offset adjuster which gives offsets to the first input current and the second input current respectively to generate a first output current and a second output current, an output stage which generates an output signal in accordance with the first output current and the second output current, and an offset current generator which generates a first offset current and a second offset current in accordance with an offset adjustment signal. The offset adjuster gives the offsets to the first input current and the second input current respectively by using the first offset current and the second offset current.

14 Claims, 17 Drawing Sheets

OPERATIONAL AMPLIFIER, MOTOR DRIVE DEVICE, MAGNETIC DISK STORAGE DEVICE, AND ELECTRONIC APPLIANCE

BACKGROUND OF THE INVENTION

1. Field of the Invention

The invention described in this specification relates to an A/D [analog-to-digital] converter, an operational amplifier, or a back electromotive force monitoring circuit.

2. Description of Related Art

Generally, an A/D converter is proposed, which performs a plurality of times of A/D conversion processing sequentially (cf., JP-A-2009-033861). However, the A/D converter leaves room for improvement as to an increase in processing speed.

Generally, an operational amplifier is proposed, which comprises an offset adjustment function (cf., JP-A-2008-004156). However, the operational amplifier leaves room for improvement as to reduction of a circuit scale and linearity of the offset adjustment.

Generally, a back electromotive force monitoring circuit is proposed, which monitors the back electromotive force generated by a motor (cf., JP-A-2002-063773). However the back electromotive force monitoring circuit leaves room for improvement as to accuracy in monitoring.

SUMMARY OF THE INVENTION

A subject of the present invention described in the present specification is to solve the above-described problems found by the present applicant.

In the invention described in the present specification, an A/D converter according to a first invention has an analog multiplexer stage which selects one of a plurality of first analog signals as a second analog signal, an amplifier stage which amplifies the second analog signal to generate a third analog signal, an A/D conversion stage which converts the third analog signal into a digital signal, and a sequencer which controls those stages. The sequencer performs input switching processing in the analog multiplexer stage on completion of sample hold processing by the A/D conversion stage, when performing a plurality of times of A/D conversion processing sequentially, without waiting for completion of the A/D conversion processing.

In the invention described in the present specification, an operational amplifier according to a second invention has an input stage which generates a first input current and a second input current in accordance with a first input signal and a second input signal, an offset adjuster which gives offsets to the first input current and the second input current respectively to generate a first output current and a second output current, an output stage which generates an output signal in accordance with the first output current and the second output current, and an offset current generator which generates a first offset current and a second offset current in accordance with an offset adjustment signal. The offset adjuster gives the offsets to the first input current and the second input current respectively by using the first offset current and the second offset current.

In the invention described in the present specification, a back electromotive force monitoring circuit according to a third invention has a speed detection voltage generator which biases a back electromotive force generated by a voice coil motor with a predetermined reference voltage to generate a speed detection voltage, and a calculator which generates a motor control signal in accordance with the speed detection voltage. The calculator includes a subtracter which subtracts the reference voltage from the speed detection voltage prior to generation of the motor control signal.

Here, as to the invention described in present specification, other features, elements, steps, advantages and characteristics of the present invention will become more apparent from the following detailed description of preferred embodiments of the present invention and the attached drawings.

DETAILED DESCRIPTION OF PREFERRED EMBODIMENTS

<Motor Drive Device>

Figure 1:
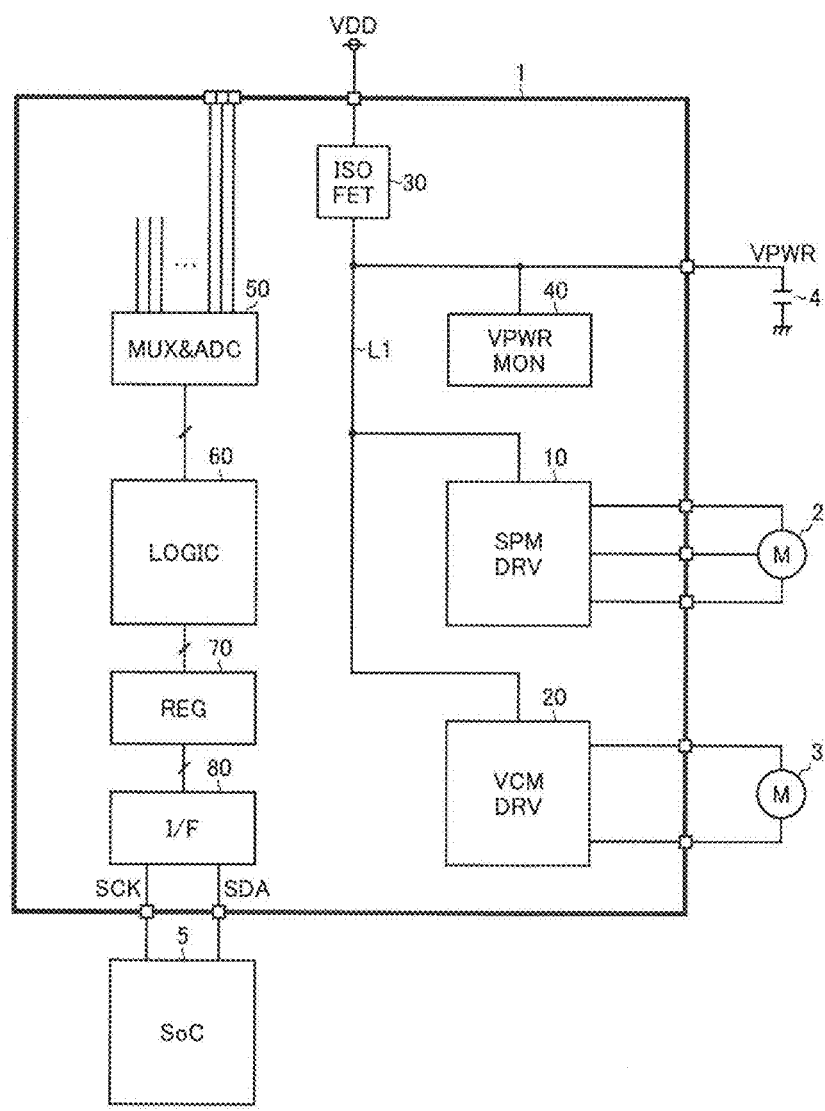
FIG. 1 is a block diagram showing a structural example of a motor drive device.

FIG. 1 is a block diagram showing a structural example of a motor drive device. The motor drive device 1 of this structural example is a monolithic semiconductor integrated circuit device (i.e., a system motor driver IC) which performs drive control of a spindle motor 2 and a voice coil motor 3 used in a hard disk drive: has a spindle motor driver 10; a voice coil motor driver 20; an insulation switch 30; a power voltage monitor 40; A/D converter 50; a logic unit 60; a register 70; and a serial interface 80.

Besides, the motor drive device 1 has various kinds of power supply circuits (step-down/step-up/inverting switching regulators, a positive/negative output charge pump, a series regulator, etc.) to supply electric power to the inside and the outside of devices, and various kinds of sensor detection circuits to monitor an output of an external sensor (a shock sensor, a pressure sensor, a temperature sensor, and so on) except the above-mentioned structural elements. Here, the whole structure of the hard disk drive that incorporates the motor drive device 1 are illustrated below in detail.

A power supply voltage VDD (e.g., 12V) is applied from a host of an external device to a power supply line L1 of a motor drive system as a power voltage VPWR for driving the spindle motor 10 and the voice coil motor driver 20. Here, a capacitor 4 for smoothing the power voltage VPWR is provided in the form of an external component to the power supply line L1.

The spindle motor driver 10 is connected to the power supply line L1, and rotates a platter (a magnetic disk) at predetermined rotation speeds by rotating the spindle motor 2 (e.g., a 3-phase brushless DC motor in the present structural example) with the power supply voltage VDD when the power supply voltage is normal. On the other hand, the spindle motor driver 10 rectifies phase voltages, one for each phase, generated during idling of the spindle motor 2, and regenerates rectified phase voltages to the power supply line L1 as the power voltage VPWR when the power supply voltage VDD is abnormal (e.g., power supply interruptions, instantaneous power failure, and so on). The power voltage VPWR is provided for relevant parts (e.g., the voice coil motor 20 etc.) of the motor drive device 1 via the power supply line L1.

The voice coil motor driver 20 is connected to the power supply line L1, and moves a magnetic head on the platter in a tracking mode by driving the voice coil motor 3 with the power supply voltage VDD when the power supply voltage VDD is normal. On the other hand, the voice coil motor driver 20 drives the voice coil motor 20 with the power voltage VPWR regenerating from the spindle motor driver 10 to the power supply line L1 when the power supply voltage is abnormal. Thus, it is possible to operate the magnetic head automatically to an outside lamp mechanism further than an outermost circumference of the platter. A collision between the magnetic head and the platter is avoidable in advance by possessing such a power off retraction function when the power supply voltage VDD is abnormal.

The insulation switch 30 is a backflow prevention element which connects and disconnects a power supply pin (an external terminal to apply the power supply voltage VDD) of the motor driver 1 to and from the power supply line L1. The insulation switch 30 turns on when the power supply voltage VDD is normal, and turns off when the power supply voltage VDD is abnormal. A MOS [metal oxide semiconductor] field effect transistor, a diode and the like are preferably usable as the insulation switch 30.

The power voltage monitor 40 monitors the power voltage VPWR applied to the power supply line L1 to decide that the power voltage VPWR is normal or abnormal (consequently, to decide that the power supply voltage VDD is normal or abnormal). The decision of the power voltage monitor 40 is used for ON/OFF control of the insulation switch 30, operation mode switch control (switch control of normal mode/rectified regeneration mode) of the spindle motor driver 10, etc.

The A/D converter 50 converts a plurality of analog signals inputted from the inside and the outside of devices into digital signals to output the digital signals to the logic unit 60.

The logic unit 60 controls entire operation of the motor drive device 1 comprehensively based on various digital signals inputted from the A/D converter 50, various register data read from the register 70, and so on.

The register 70 stores the various register data written from a microcomputer 5 (SoC [system-on chip]) and the logic unit 60 in a volatile manner.

The serial interface 80 performs, for example, serial communication with the microcomputer 5 (a main element controlling entire operation of a hard disk drive comprehensively) located to the outside of the motor drive device 1 based on a SPI [serial peripheral interface] standard.

<A/D Converter>

Figure 2:
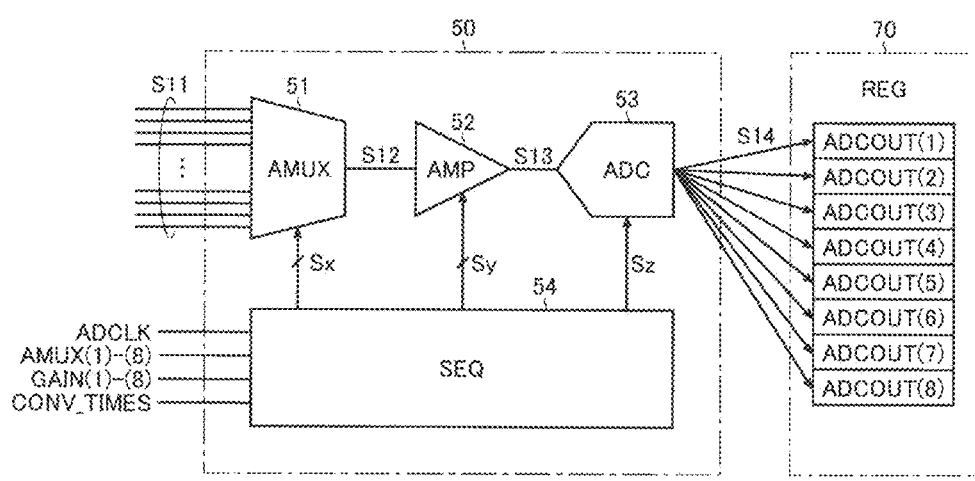
FIG. 2 is a block diagram showing a structural example of an A/D converter 50.

FIG. 2 is a block diagram showing a structural example of an A/D converter 50. The A/D converter in the present structural example includes an analog multiplexer stage 51, an amplifier stage 52, an A/D conversion stage 53, and a sequencer 54.

An analog multiplexer stage 51 selects one of a plurality of first analog signals S11 as a second analog signal S12. Here, a signal input path selected by the analog multiplexer stage 51 can be optionally switched with an input switching signal Sx from a sequencer 54.

The amplifier stage 52 generates a third analog signal S13 by amplifying the second analog signal S12. A gain of the amplifier stage 52 can be optionally switched in accordance with a gain switching signal Sy from the sequencer 54. Besides, the amplifier stage 52 has a signal path which outputs the second analog signal S12 as the third analog signal S13 without being subjected to any process.

The A/D conversion stage 53 is a successive approximation type, and converts the third analog signal S13 into digital signals S14 (e.g., 12-bit) by repeating a plurality of times of comparison processing of an input-output signal at the timing in accordance with an A/D control signal Sz.

The sequencer 54 operates in synchronization with a clock signal ADCLK of a predetermined frequency (e.g., 20 MHz), and controls those stages 51 to 53 so as to perform a plurality of times of AD conversion processing sequentially. More specifically, the sequencer 54 read register values stored in various kinds of setting registers (input setting registers (AMUX(1)-(8)), gain setting registers (GAIN(1)-(8)), conversion number setting registers (CONV_TIMES), etc.) to generate the input switching signal Sx, the gain switching signal Sy, and the A/D control signal Sz in accordance with the register values.

Here, a series of digital signals S14 generated by sequential A/D conversion processing are appropriately read by the microcomputer 5 as necessary after the digital signals S14 are stored in designated addresses (e.g., ADCOUT(1)-(8)) of the register 70 via a logic unit 60 (not shown in FIG. 2).

Figure 3:
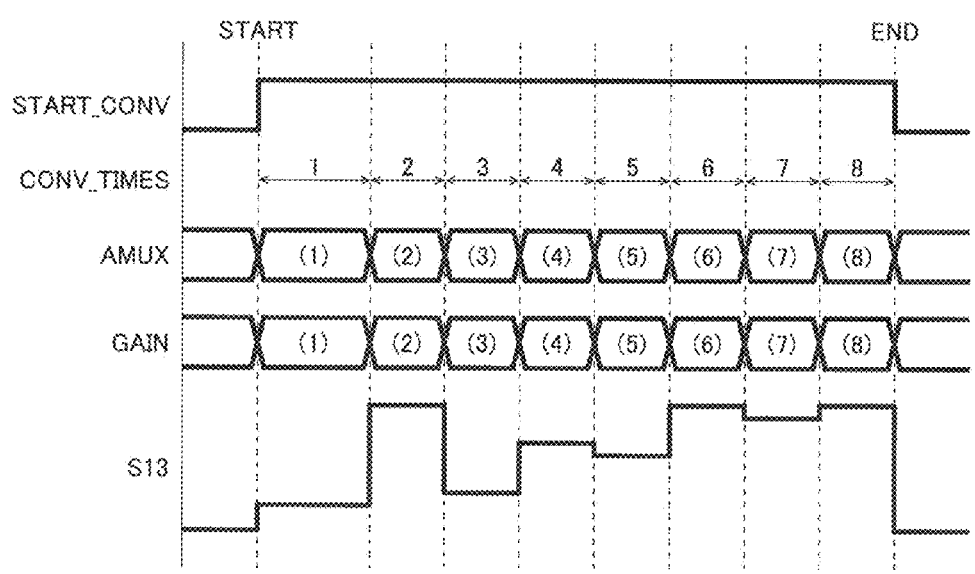
FIG. 3 is a simplified timing chart showing an example of sequential A/D conversion operation.

FIG. 3 is a simplified timing chart showing an example of sequential A/D conversion operation, and, describes an A/D conversion start flag (START_CONV), the number of A/D conversion (CONV_TIMES), an input setting state (AMUX), a gain setting state (GAIN), and a third analog signal S13, in order from top.

When an A/D conversion processing command (serial command) is inputted, the sequencer 54 raises the A/D conversion start flag (START_CONV) to a high level, and performs only the number of times of the designated A/D conversion processing (e.g., a maximum of 8 times) sequentially. At that time, the sequencer 54 successively performs the input switching processing of the analog multiplexer stage 51 and the gain switching processing of the amplifier stage 52 every the plurality of times of the A/D conversion processing.

Figure 4:
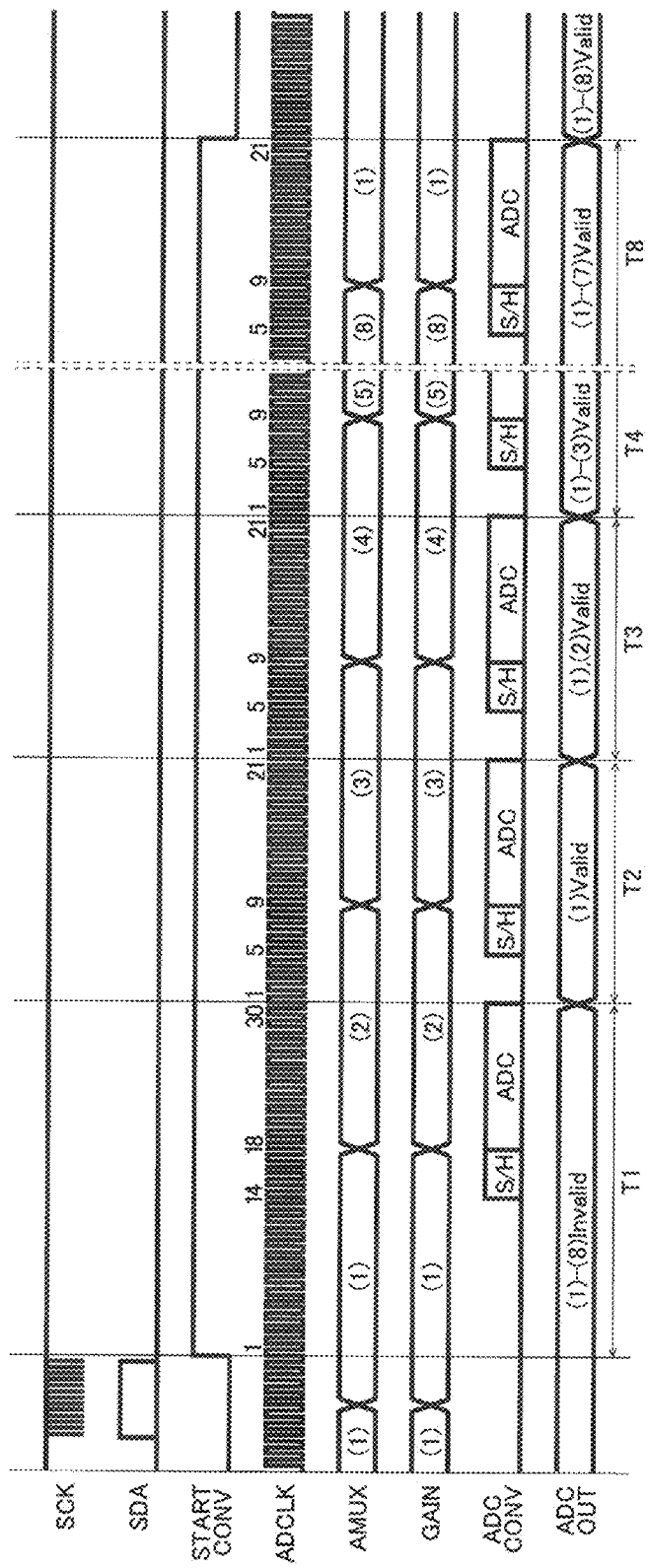
FIG. 4 is a detailed timing chart showing an example of sequential A/D conversion operation.

FIG. 4 is a detailed timing chart showing an example of sequential A/D conversion operation, and describes a serial clock signal SCK, a serial data signal SDA, the A/D conversion start flag (START_CONV), the clock signal ADCLK, the input setting state (AMUX), the gain setting state (GAIN), an ADC conversion state (ADCCONV), and an ADC output state (ADCOUT), in order from top.

The sequencer 54 initializes the analog multiplexer stage 51 to a fixed input setting state (AMUX(1)), and initializes the amplifier stage 52 to a fixed gain setting state (GAIN(1)), when recognizing the A/D conversion processing command included in the serial data signal SDA. For example, the sequencer 54 performs the above-mentioned initialization processing when a register for storing of the A/D conversion processing command is addressed.

According to such a structure, it is possible to gain input settling time (time until a voltage value of the third analog signal S13 inputted into the A/D conversion stage 53 converges) in the A/D conversion processing period T1 of the first time because the sequencer 54 initializes the analog multiplexer stage 51 and the amplifier stage 52 before raising the A/D conversion start flag (START_CONV) to the high level. However, timing of the above-mentioned initialization processing limit signal S1 is not limited to this, and the timing may correspond with timing for raising the A/D conversion start flag (START_CONV) to the high level.

Then, when the input of an A/D conversion processing command is complete (when all of the necessary information for the sequential A/D conversion processing are given), the sequencer 54 raises the A/D conversion start flag (START_CONV) which is its own internal flag to the high level, and starts counting pulses of the clock signal ADCLK to perform a series of the sequential A/D conversion processing.

In the A/D conversion processing period T1 of the first time, the sequencer 54 starts sample hold processing of the A/D conversion stage 53 at the fourteenth pulse of the clock signal ADCLK to complete the sample hold processing at the eighteenth pulse. Besides, when the sample hold processing is complete, the sequencer 54 switches the analog multiplexer stage 51 to the next input setting state (AMUX(2)), and switches the amplifier stage 52 to the next gain setting state (GAIN(2)). Then, the sequencer 54 performs the A/D conversion processing (successive approximation processing) of the A/D conversion stage 53 every one pulse from the nineteenth pulse to the thirtieth pulse of the clock signal ADCLK. Consequently, the A/D conversion processing of the first time is complete at the thirtieth pulse of the clock signal ADCLK, and fixes a 12-bit output value (ADCOUT(1)). After the output value (ADCOUT(1)) is fixed, the sequencer 54 resets count of the pulses of the clock signal ADCLK, and is switched to the A/D conversion processing period T2 of the second time.

In the A/D conversion processing period T2 of the second time, the sequencer 54 starts sample hold processing of the A/D conversion stage 53 at the fifth pulse of the clock signal ADCLK to complete the sample hold processing at the ninth pulse. Besides, when the sample hold processing is complete, the sequencer 54 switches the analog multiplexer stage 51 to the next input setting state (AMUX(3)), and switches the amplifier stage 52 to the next gain setting state (GAIN(3)). Then, the sequencer 54 performs the A/D conversion processing (successive approximation processing) of the A/D conversion stage 53 every one pulse from the ninth pulse to the twenty-first pulse of the clock signal ADCLK. Consequently, the A/D conversion processing of the second time is complete at the twenty-first pulse of the clock signal ADCLK, and fixes a 12-bit output value (ADCOUT(2)). After the output value (ADCOUT(2)) is fixed, the sequencer 54 resets count of the pulses of the clock signal ADCLK, and is switched to the A/D conversion processing period T3 of the third time.

After the above-mentioned sequential A/D conversion processing, all eight output values (ADCOUT(1)-(8)) are decided finally by repeating the same sequence as the A/D conversion processing period T2 of the second time. At the time, the sequencer 54 drops the A/D conversion start flag (START_CONV) to a low level to complete a series of the sequential A/D conversion processing.

As key operation, the sequencer 54 performs the input switching processing of the analog multiplexer stage 51 and the gain switching processing of the amplifier stage 52 on completion of sample hold processing by the A/D conversion stage 53 without waiting for completion of the A/D conversion processing.

In the conventional sequence, the input switching processing of the analog multiplexer stage 51 and the gain switching processing of the amplifier stage 52 is not performed until the A/D conversion processing is complete. Therefore, it is necessary to basically set the A/D conversion processing periods T2 to T8 of second time or later to the same length as the A/D conversion processing periods T1 of the first time.

On the other hand, according to the above-mentioned new sequence, the necessary time for the previous A/D conversion processing can be utilized effectively as the input settling time before the next A/D conversion processing. Accordingly, in the A/D conversion processing periods T2 to T8 of the second time or later, it is possible to shorten standby time from the completion of the previous A/D conversion processing to the start of the next sample hold processing. In other words, it is possible to set the A/D conversion processing period Tx (total processing time from the decision of the previous output value (ADCOUT(x-1)) to the decision of the next output value (ADCOUT(x))) of the xth time (where x≥2) shorter than the A/D conversion processing period T1 (total processing time from the rising of the A/D conversion start flag (START_CONV) to the decision of the output value (ADCOUT(0)) of the first time) of the first time.

For example, the sequencer 54 allocates 1.5 μs to the A/D conversion processing period T1 of the first time. On the other hand, the sequencer 54 allocates 1.0 μs to the A/D conversion processing periods T2 to T8 of the second time or later respectively. As described above, according to the A/D converter 50 in the present structural example, it is possible to greatly improve a total processing speed when performing a plurality of times of A/D conversion processing sequentially because the A/D conversion processing periods T2 to T8 of the second time or later can be shortened by 0.5 μs in comparison with the A/D conversion processing period T1.

<Voice Coil Motor>

Figure 5:
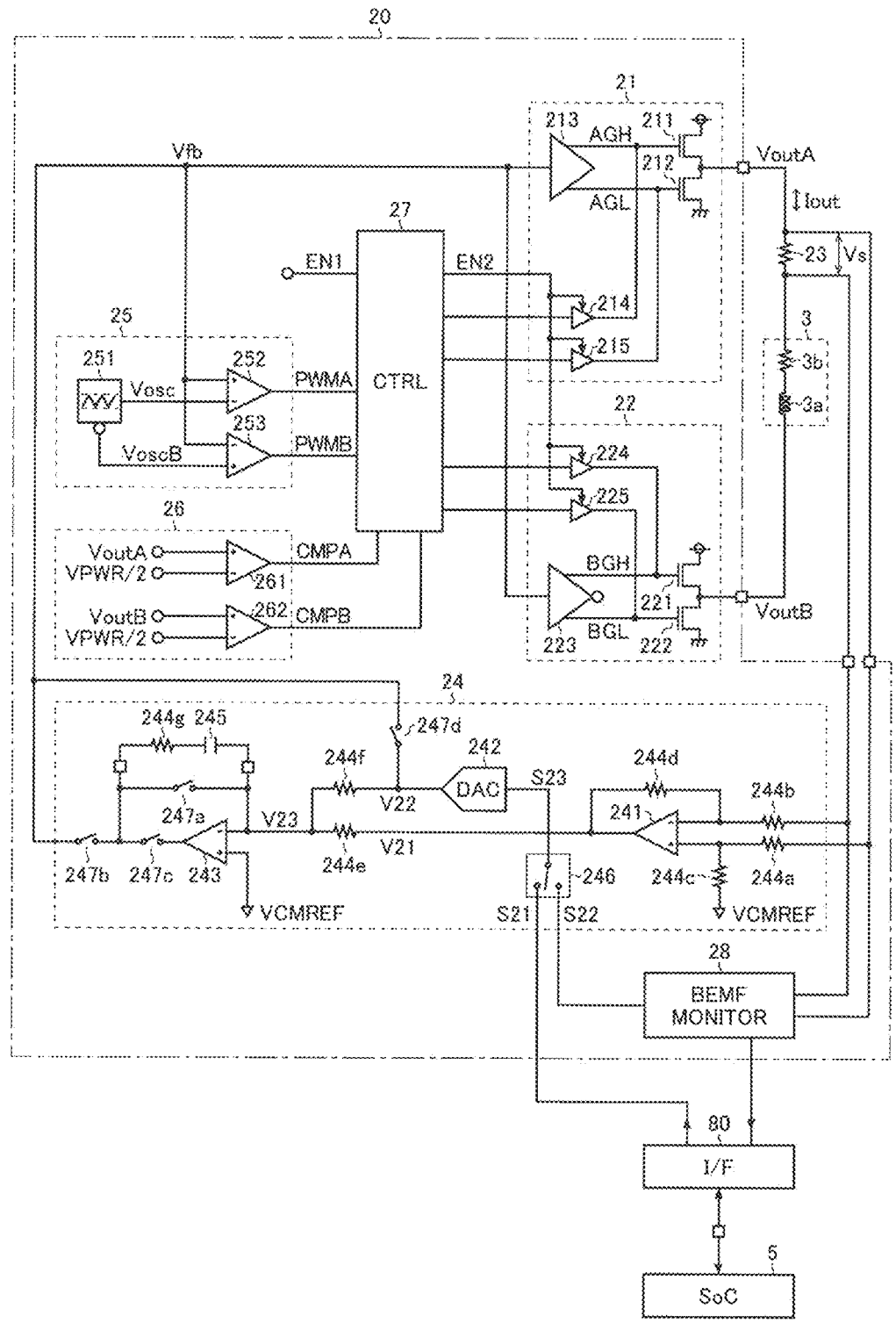
FIG. 5 is a circuit diagram showing a structural example of a voice coil motor driver 20.

FIG. 5 is a circuit diagram showing a structural example of a voice coil motor driver 20. The voice coil motor driver 20 in the present structural example includes driver circuits 21 and 22, a sense resistor 23, an output feedback circuit 24, a PWM [pulse width modulation] signal generation circuit 25, an output voltage monitoring circuit 26, control circuit 27, and a back electromotive force monitoring circuit 28 to generate an output current Iout flowing into the voice coil motor 3.

The voice coil motor 3 is one of objects for drive of the motor drive device 1, and is driven by supplying the output current Iout for a coil 3a. Here, a resistance component 3b accompanies the coil 3a of the voice coil motor 3 in series.

The driver circuit 21 generates the output current Iout to the voice coil motor 3 with the driver circuit 22. The driver 21 circuit includes output transistors 211 and 212, a linear driver 213, and pre-drivers 214 and 215.

The output transistor 211 is an upper side switch element (NMOSFET [N-channel type metal oxide semiconductor field effect transistor]) which connects and disconnects a first terminal of the voice coil motor 3 to and from an application terminal of a power voltage VPWR (power supply voltage VDD). A drain of the output transistor 211 is connected to the application terminal of the power voltage VPWR. A source of the output transistor 211 is connected to an application terminal of an output voltage VoutA (the first terminal of the voice coil motor 3). A gate of the output transistor 211 is connected to an application terminal of a gate voltage AGH. Here, the output transistor 211 can use a PMOSFET instead of the NMOSFET.

The output transistor 212 is a lower side switch element (NMOSFET) which connects and disconnects the first terminal of the voice coil motor 3 to and from an application terminal of a ground voltage GND. A drain of the output transistor 212 is connected to the application terminal of the output voltage VoutA. A source of the output transistor 212 is connected to the application terminal of the ground voltage GND. A gate of the output transistor 212 is connected to an application terminal of a gate voltage AGL.

The linear driver 213 continuously varies the gate voltages AGH and AGL based on a feedback voltage Vfb. More specifically, the linear driver 213 makes the gate voltage AGH higher and makes the gate voltage AGL lower as the feedback voltage Vfb is higher than a reference voltage VCMREF. To the contrary, the linear driver 213 makes the gate voltage AGH lower and makes the gate voltage AGL higher as the feedback voltage Vfb is lower than the reference voltage VCMREF. Here, a class-AB power amplifier is preferably usable to an output stage of the linear driver 213.

The pre-driver 214 periodically switches the gate voltage AGH of the output transistor 211 to a high level (VoutA+Vreg) or a low level (VoutA) based on indication of the control circuit 27 so as to perform PWM drive of the output transistor 211 when an internal enabling signal EN2 is a logical level on enabling a PWM (e.g., a high level). On the other hand, the pre-driver 214 becomes a high impedance state without depending on the indication of the control circuit 27 and is separated from the gate of the output transistor 211 so as not to prevent linear drive of the output transistor 211 when the internal enabling signal EN2 is a logical level on disabling the PWM (e.g., a low level).

The pre-driver 215 periodically switches the gate voltage AGL of the output transistor 212 to a high level (Vreg) or a low level (GND) based on the indication of the control circuit 27 so as to perform PWM drive of the output transistor 212 when the internal enabling signal EN2 is a logical level on enabling the PWM (e.g., a high level). On the other hand, the pre-driver 215 becomes a high impedance state without depending on the indication of the control circuit 27 and is separated from the gate of the output transistor 212 so as not to prevent the linear drive of the output transistor 212 when the internal enabling signal EN2 is a logical level on disabling the PWM (e.g., a low level).

The driver circuit 22 generates the output current Tout to the voice coil motor 3 with the driver circuit 21. The driver 22 circuit includes output transistors 221 and 222, a linear driver 223, and pre-drivers 224 and 225.

The output transistor 221 is an upper side switch element (NMOSFET) which connects and disconnects a second terminal of the voice coil motor 3 to and from the application terminal of the power voltage VPWR. A drain of the output transistor 221 is connected to the application terminal of the power voltage VPWR. A source of the output transistor 221 is connected to an application terminal of an output voltage VoutB (the second terminal of the voice coil motor 3). A gate of the output transistor 221 is connected to an application terminal of a gate voltage BGH. Here, the output transistor 221 can use a PMOSFET instead of the NMOSFET.

The output transistor 222 is a lower side switch element (NMOSFET) which connects and disconnects the second terminal of the voice coil motor 3 to and from the application terminal of the ground voltage GND. A drain of the output transistor 222 is connected to the application terminal of the output voltage VoutB. A source of the output transistor 222 is connected to the application terminal of the ground voltage GND. A gate of the output transistor 222 is connected to an application terminal of a gate voltage BGL.

The linear driver 223 continuously varies the gate voltages BGH and BGL based on the feedback voltage Vfb. However, the linear driver 223 has reverse output polarity to the linear driver 213. More specifically, the linear driver 223 makes the gate voltage BGH lower and makes the gate voltage BGL higher as the feedback voltage Vfb is higher than the reference voltage VCMREF. To the contrary, the linear driver 223 makes the gate voltage BGH higher and makes the gate voltage AGL lower as the feedback voltage Vfb is lower than the reference voltage VCMREF. Here, a class-AB power amplifier is preferably usable to an output stage of the linear driver 223.

The pre-driver 224 periodically switches the gate voltage BGH of the output transistor 221 to a high level (VoutB+Vreg) or a low level (VoutB) based on the indication of the control circuit 27 so as to perform PWM drive of the output transistor 221 when the internal enabling signal EN2 is a logical level on enabling the PWM (e.g., a high level). On the other hand, the pre-driver 224 becomes a high impedance state without depending on the indication of the control circuit 27 and is separated from the gate of the output transistor 221 so as not to prevent linear drive of the output transistor 221 when the internal enabling signal EN2 is a logical level on disabling the PWM (e.g., a low level).

The pre-driver 225 periodically switches the gate voltage BGL of the output transistor 222 to a high level (Vreg) or a low level (GND) based on indication of the control circuit 27 so as to perform PWM drive of the output transistor 222 when the internal enabling signal EN2 is a logical level on enabling the PWM (e.g., a high level). On the other hand, the pre-driver 225 becomes a high impedance state without depending on the indication of the control circuit 27 and is separated from the gate of the output transistor 222 so as not to prevent the linear drive of the output transistor 222 when the internal enabling signal EN2 is a logical level on disabling the PWM (e.g., a low level).

The sense resistor 23 (resistance value: Rs) is connected to the voice coil motor 3 in series, and generates a voltage Vs (=Iout*Rs) across both terminals of the sense resistor 23 in accordance with the output current voltage Tout.

The output feedback circuit 24 monitors the voltage Vs (corresponding to a detection result of the output current Iout) across both terminals of the sense resistor 23 to generate the feedback voltage Vfb. As described above, it is possible to accurately control an extremely small output current Tout because the voice coil motor driver 20 in the present structural example has the output feedback circuit 24 for a current mode to perform feedback control of the output current Iout. Here, the output feedback circuit 24 includes an operational amplifier 241, a D/A converter 242, an error amplifier 243, resistors 244a to 244g, a capacitor 245, a selector 246, and switches 247a to 247d.

A non-inverting input terminal (+) of the operational amplifier 241 is connected to a first terminal of the sense resistor 23 (a connection node between the first terminal of the sense resistor 23 and the driver circuit 21) via the resistor 244a. An inverting input terminal (−) of the operational amplifier 241 is connected to a second terminal of the sense resistor 23 (a connection node between the second terminal of the sense resistor 23 and the voice coil motor 3) via the resistor 244b. The resistor 244c is connected between the non-inverting input terminal (+) of the operational amplifier 241 and an application terminal of the reference voltage VCMREF. The resistor 244d is connected between the inverting input terminal (−) and an output terminal of the operational amplifier 241. The output terminal of the operational amplifier 241 is connected to an inverting input terminal (−) of the error amplifier 243 via the resistor 244e (resistor value: Rf). A first input terminal of the selector 246 is connected to an application terminal of a first motor control signal S21 (e.g., 15-bit digital signal) inputted via the serial interface 80 from the microcomputer 5. A second input terminal of the selector 246 is connected to an application terminal of a second motor control signal S22 (e.g., 15-bit digital signal) inputted from the back electromotive force monitoring circuit 28. An input terminal of the D/A converter 242 is connected to an output terminal of the selector 246 (an application terminal of a third motor control signal S23). An output terminal of the D/A converter 242 is connected to the inverting input terminal (−) of the error amplifier 243 via the resistor 244f (resistor value: Ri). A non-inverting input terminal (+) of the error amplifier 243 is connected to the application terminal of the reference voltage VCMREF. The resistor 244g and the capacitor 245 are connected in series between the inverting input terminal (−) and an output terminal of the error amplifier 243.

A first terminal of the switch 247a is connected to the inverting input terminal (−) of the error amplifier 243. A second terminal of the switch 247a is connected to each of first terminals of the switch 247b and 247c. A second terminal of the switch 247b is connected to an application terminal of the feedback voltage Vfb. A second terminal of the switch 247c is connected to the output terminal of the error amplifier 243. A first terminal of the switch 247d is connected to the output terminal of the D/A converter 242. A second terminal of the switch 247d is connected to the application terminal of the feedback voltage Vfb. Here, switching control of the switches 247a to 247d is described in detail later.

In the output feedback circuit 24 having the above structure, the operational amplifier 241 forms a differential amplifier with resistors 244a to 244d to generate a voltage V21 by amplifying the voltage Vs across both terminals of the sense resistor 23. The voltage V21 becomes a voltage signal which varies on a basis of the reference voltage VCMREF.

The D/A converter 242 generates a voltage V22 based on the third motor control signal S23 (e.g., 15-bit digital signal) outputted from the selector 246.

The error amplifier 243 amplifies a difference between a voltage V23 (=(Ri*V21+Rf*V22)/(Rf+Ri)) based on both the voltage V21 and the voltage V22 and the predetermined reference voltage VCMREF to generate the feedback voltage Vfb. If the output current Iout flows from the driver circuit 21 into the driver circuit 22 via the voice coil motor 3, the feedback voltage Vfb changes in the range of the voltage higher than the reference voltage VCMREF. To the contrary, if the output current Iout flows from the driver circuit 22 into the driver circuit 21 via the voice coil motor 3, the feedback voltage Vfb varies in the range of the voltage lower than the reference voltage VCMREF.

The PWM signal generation circuit 25 compares the feedback voltage with a slope voltage Vosc and an inverting slope voltage VoscB respectively to generate a PWM signal PWMA and a PWM signal PWMB. The PWM signal generation circuit 25 includes an oscillator 251 and comparators 252 and 253.

The oscillator 251 generates a slope voltage Vosc having a triangle waveform or a sawtooth waveform of a predetermined frequency and an inverting slope voltage VoscB which inverts the slope voltage Vosc.

The comparator 252 compares the feedback voltage Vfb applied to a non-inverting input terminal (+) thereof with the slope voltage Vosc applied to an inverting input terminal (−) thereof to generate the PWM signal PWMA.

The comparator 253 compares the feedback voltage Vfb applied to an inverting input terminal (−) thereof with the inverting slope voltage VoscB applied to a non-inverting input terminal (+) thereof to generate the PWM signal PWMB.

The output voltage monitoring circuit 26 monitors the output voltages VoutA and VoutB applied to the voice coil motor 3. The output voltage monitoring circuit 26 includes comparators 261 and 262.

The comparator 261 compares the output voltage VoutA applied to a non-inverting input terminal (+) thereof with a threshold voltage Vth (=VPWR/2) applied to an inverting input terminal (−) thereof to generate a comparison signal CMPA.

The comparator 262 compares the output voltage VoutB applied to a non-inverting input terminal (+) thereof with the threshold voltage Vth (=VPWR/2) applied to an inverting input terminal (−) thereof to generate a comparison signal CMPB.

The control circuit 27 receives an external enabling signal EN1, the PWM signal PWMA and PWMB, and the comparison signal CMPA and CMPB as input signals to perform drive control (including the generation of the internal enabling signal EN2) of the driver circuits 21 and 22. In particular, when the driver circuits 21 and 22 are switched from a PWM drive state to a linear drive state, the control circuit 27 controls the switching timing so as not to change a path into which the output current Iout flows before and after the switch thereof, and controls the pre-drivers (214, 215, 224, and 225) so as to switch the drive circuits 21 and 22 to a high impedance state once on the way of the switch thereof. According to the above-mentioned control, it is possible to perform the switch of the motor drive system smoothly without a glitch of the output current Tout or a flow-through current (consequently, unnecessary energy loss) to an output stage of the power amplifier.

The back electromotive force monitoring circuit 28 monitors a BEMF [back electromotive force] generated by the voice coil motor 3 to send the above-mentioned monitoring result via the serial interface 80 or to use the monitoring result for PI [proportinal/integral] calculation of the back electromotive force monitoring circuit 28.

<Back Electromotive Force Monitoring Circuit>

Figure 6:
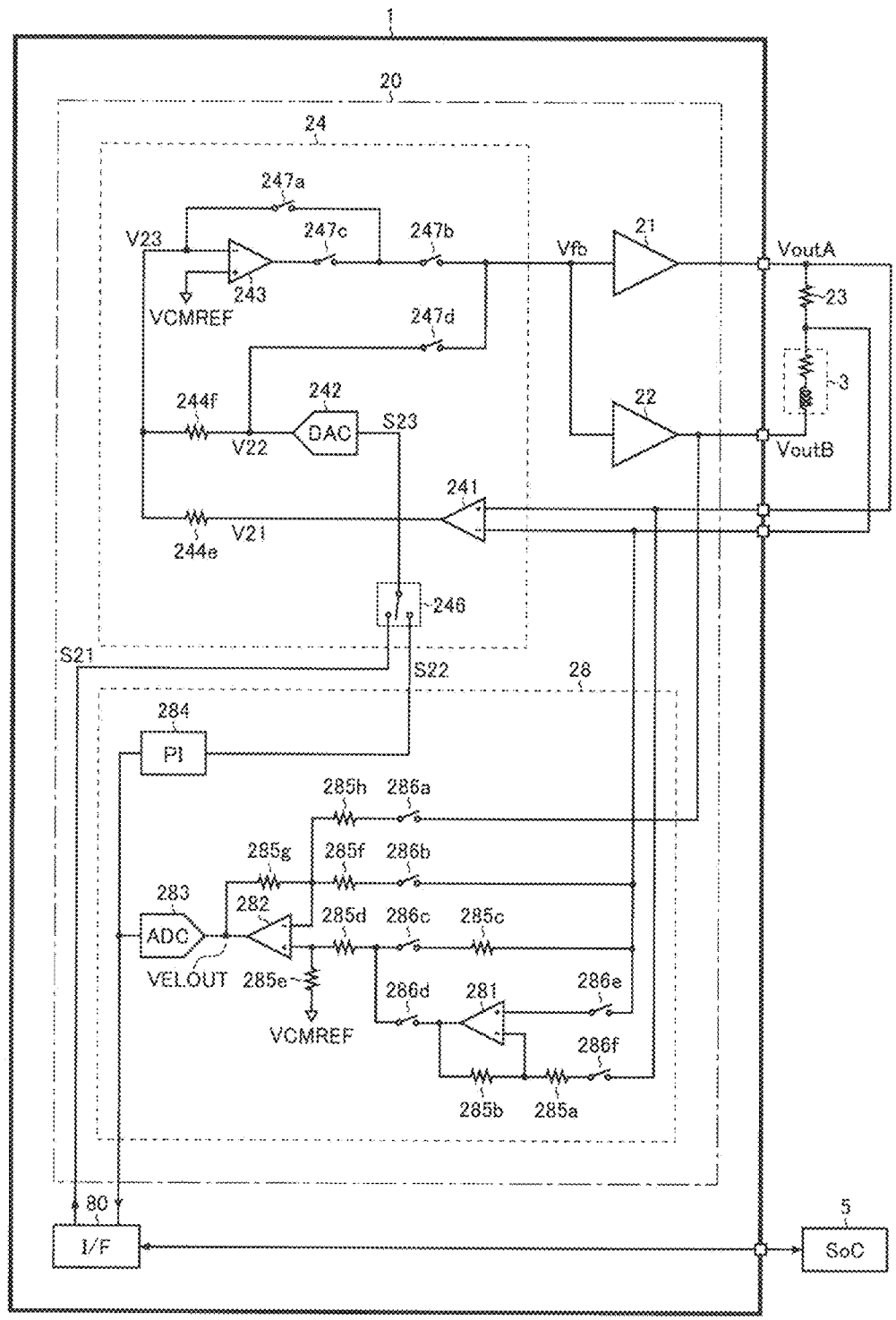
FIG. 6 is a circuit diagram showing a structural example of a back electromotive force monitoring circuit 28.

FIG. 6 is a circuit diagram showing a structural example of a back electromotive force monitoring circuit 28. The back electromotive force monitoring circuit 28 in the present structural example includes operational amplifiers 281 and 282, an A/D converter 283, a PI calculator 284, resistors 285a to 285h, and switches 286a to 286f.

An inverting input terminal (−) of the operational amplifier 281 is connected to the first terminal of the sense resistor 23 (the connection node between the first terminal of the sense resistor 23 and the driver circuit 21) via the resistor 285a and the switch 286f, and moreover, is connected to an output terminal of the operational amplifier 281 via the resistor 285b. A non-inverting input terminal (+) of the operational amplifier 281 is connected to the second terminal of the sense resistor 23 (the connection node between the second terminal of the sense resistor 23 and the voice coil motor 3) via the switch 286e.

An inverting input terminal (−) of the operational amplifier 282 is connected to an output terminal of the driver circuit 22 via the resistor 285*h* and the switches 286*a*. Besides, the inverting input terminal (−) of the operational amplifier 282 is connected to the second terminal of the sense resistor 23 (the connection node between the second terminal of the sense resistor 23 and the voice coil motor 3) via the resistor 285*f* and the switch 286*b*. Besides, the inverting input terminal (−) of the operational amplifier 282 is connected to an output terminal of the operational amplifier 282 via the resistor 285*g*.

On the other hand, a non-inverting input terminal (+) of the operational amplifier 282 is connected to each of first terminals of the resistor 285*d* and 285*e*. A second terminal of the resistor 285*d* is connected to the second terminal of the sense resistor 23 (the connection node between the second terminal of the sense resistor 23 and the voice coil motor 3) via the switch 286*c* and the resistor 285*c*, and moreover, is connected to the output terminal of the operational amplifier 281 via the switch 286*d*. A second terminal of the resistor 285*e* is connected to the application terminal of the reference voltage VCMREF. The output terminal of the operational amplifier 282 is connected to an input terminal of the A/D converter 283.

Here, the operational amplifier 281 has a function for adjusting an offset in accordance with a first offset adjustment signal (e.g., 10-bit). Besides, the operational amplifier 282 has a function for adjusting an offset in accordance with a second offset adjustment signal (e.g., 6-bit).

Besides, the operational amplifiers 281 and 282, the resistors 285*a* to 285*h*, and the switches 286*a* to 286*f* function as a speed detection voltage generator which generates a speed detection voltage VELOUT by biasing the back electromotive force BEMF generated by the voice coil motor 3 with the reference voltage VCMREF. The speed detection voltage VELOUT generated as the above becomes a voltage signal which varies a voltage value thereof up and down on the basis of the reference voltage VCMREF.

The A/D converter 283 changes a speed detection voltage VELOUT into a digital signal. Here, the above-mentioned digital signal is read to the microcomputer 5 via the serial interface 80 during continuous speed control of the voice coil motor 3. On the other hand, the above-mentioned digital signal is outputted to the PI calculator 284 during discontinuous speed control of the voice coil motor 3.

The PI calculator 284 performs the PI calculation to an output signal (a digital signal on accordance with the speed detection voltage VELOUT) of the A/D converter 283 to generate the second motor control signal S22.

<Continuous Speed Control>

Figure 7:
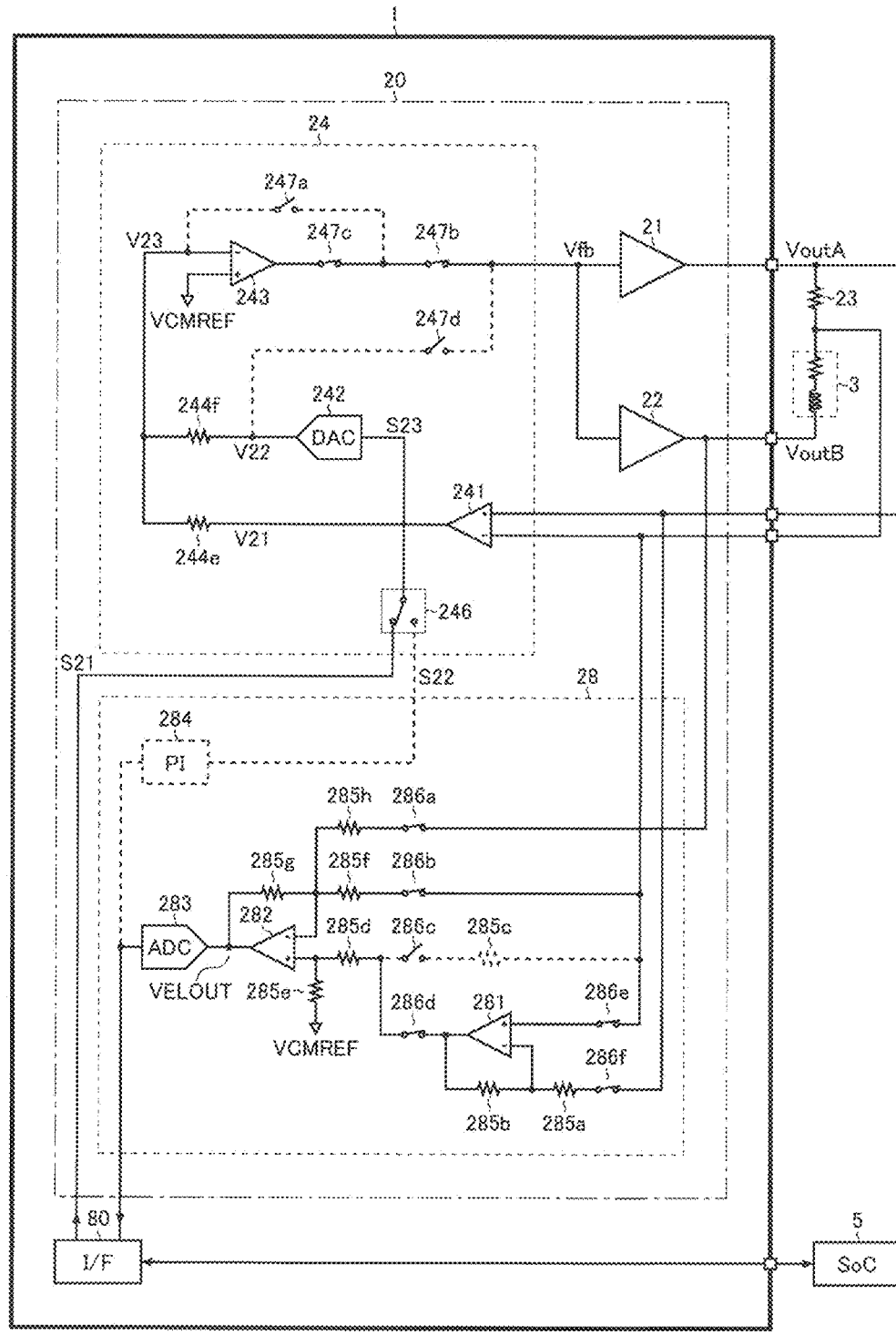
FIG. 7 is a circuit diagram showing a state of circuit connection during continuous speed control.

FIG. 7 is a circuit diagram showing a state of inside circuit connection of the voice coil motor driver 20 during continuous speed control of the voice coil motor 3. In the FIG. 7, solid lines show active signal paths, and dashed lines show inactive signal paths.

During the continuous speed control of the voice coil motor 3 which is the main constituent for controlling the microcomputer 5, the switches 247*a* and 247*d* are turned off (open circuit) and the switches 247*b* and 247*c* are turned on (short circuit) in the output feedback circuit 24. The selector 246 selects the first motor control signal S21 inputted from the microcomputer 5 via the serial interface 80 to output the first motor control signal S21 to the D/A converter 242. According to the above-mentioned switching control, the output feedback circuit 24 performs output feedback control of the voice coil motor 3 so as to move the magnetic head at the target speed set by the microcomputer 5.

Besides, during the continuous speed control of the voice coil motor 3, the switch 286*c* is turned off (open circuit) and the switches 286*a*, 186*b*, and 286*d* to 286*f* are turned on (short circuit) in the back electromotive force monitoring circuit 28. According to the above-mentioned switching control, the back electromotive force monitoring circuit 28 generates the speed detection voltage VELOUT in accordance with the motor speed (head speed) without stopping the voice coil motor 3.

Besides, during the continuous speed control of the voice coil motor 3, the output signal of the A/D converter 283 is read to the microcomputer 5 via the serial interface 80 in the back electromotive force monitoring circuit 28. According to such output switching control, it is possible to generate the first motor control signal S21 so that the motor speed can become a desired value in the microcomputer 5. Here, the first motor control signal S21 is provided for the first terminal of the selector 246 via the serial interface 80.

<Discontinuous Speed Control>

Figure 8:
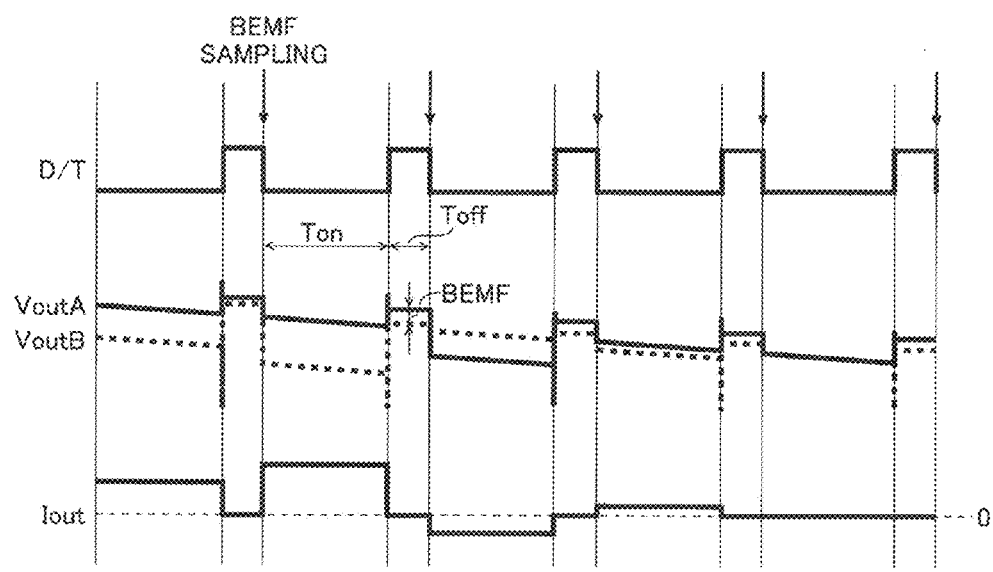
FIG. 8 is a simplified timing chart showing an example of discontinuous speed control.

FIG. 8 is a simplified timing chart showing an example of discontinuous speed control of the voice coil motor 3, and describes an operation state of the voice coil motor driver 20 (drive/tristate), the output voltages VoutA and VoutB, and the output current Tout in order from top.

As shown in the present figure, an ON period Ton and an OFF period Toff (an output high impedance period of the voice coil motor driver 20) of the voice coil motor 3 are repeated alternately during the discontinuous speed control of the voice coil motor 3. At that time, the back electromotive force monitoring circuit 28 detects the back electromotive force BEMF of the voice coil motor 3 every OFF period Toff of the voice coil motor 3 to generate the second motor control signal S22. On the other hand, the output feedback circuit 24 generates the feedback voltage Vfb from the second motor control signal S22 every ON period Ton of the voice coil motor 3. Accordingly, the output feedback control of the voice coil motor 3 is performed so as to move the magnetic head at predetermined speed in accordance with PI calculation results in the output feedback circuit 24.

Here, the motor drive device 1 performs the discontinuous speed control of the above-mentioned voice coil motor 3 to operate the magnetic head at the predetermined speed safely when the power off retraction of the magnetic head is performed during the power supply interruptions.

Figure 9:
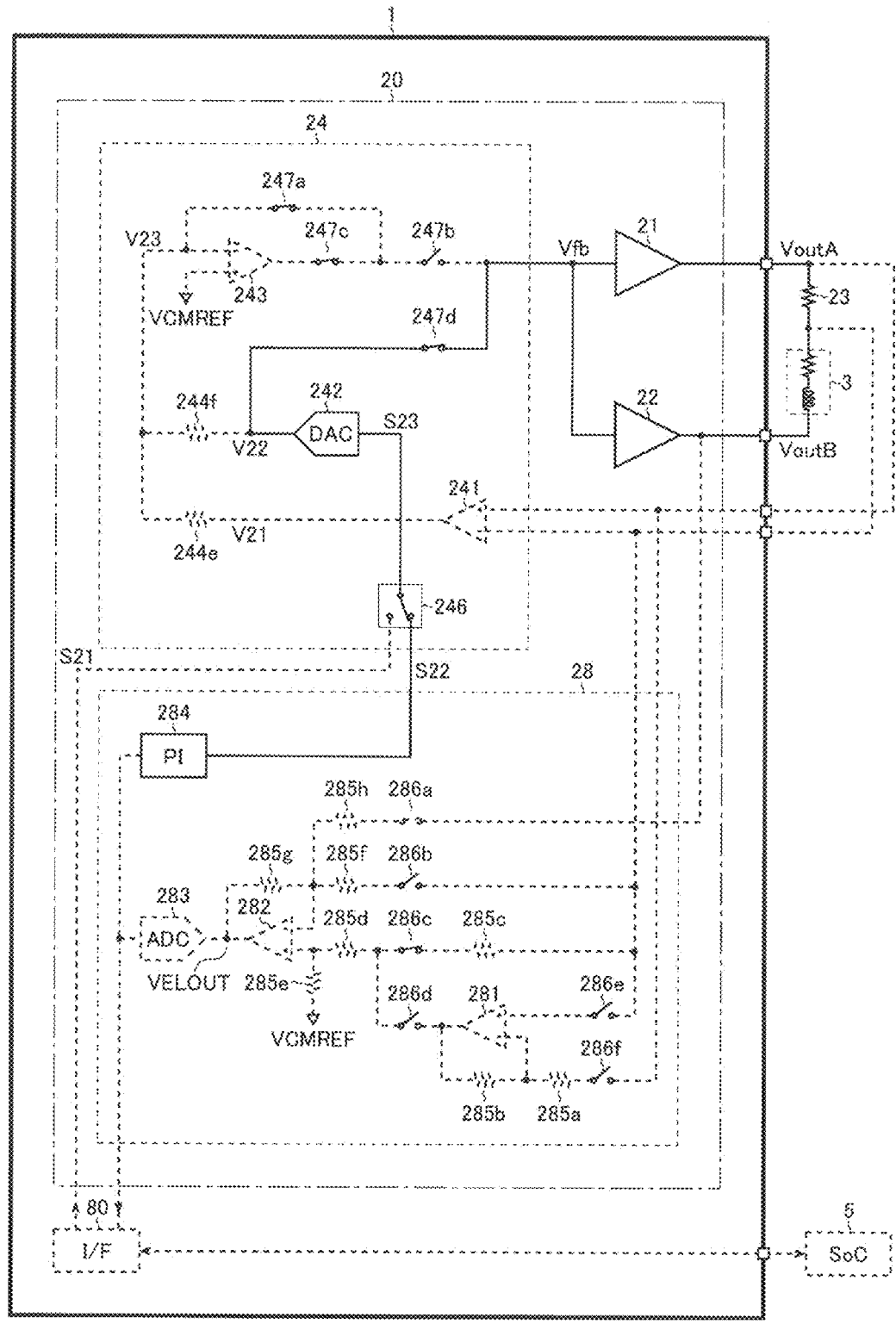
FIG. 9 is a circuit diagram showing a state of circuit connection during discontinuous speed control (ON period Ton).

FIG. 9 is a circuit diagram showing a state of inside circuit connection of the voice coil motor driver 20 during the discontinuous speed control (ON period Ton) of the voice coil motor 3. In the FIG. 9, solid lines show active signal paths, and dashed lines show inactive signal paths.

During the ON period Ton of the voice coil motor 3, the switch 247*b* is turned off (open circuit) and the switches 247*a*, 247*c*, and 247*d* are turned on (short circuit) in the output feedback circuit 24. The selector 246 selects the second motor control signal S22 inputted from the PI calculator 284 to output the second motor control signal S22 to the D/A converter 242. According to the above-mentioned switching control, the output feedback circuit 24 performs the output feedback control of the voice coil motor 3 so as to move the magnetic head at the predetermined speed in accordance with the PI calculation results.

On the other hand, in the ON period Ton of the voice coil motor 3, the back electromotive force monitoring circuit 28 outputs the second motor control signal S22 generated immediately before the OFF period Toff, and invalidates detection of the back electromotive force BEMF operation (generating operation of the speed detection voltage VELOUT).

Figure 10:
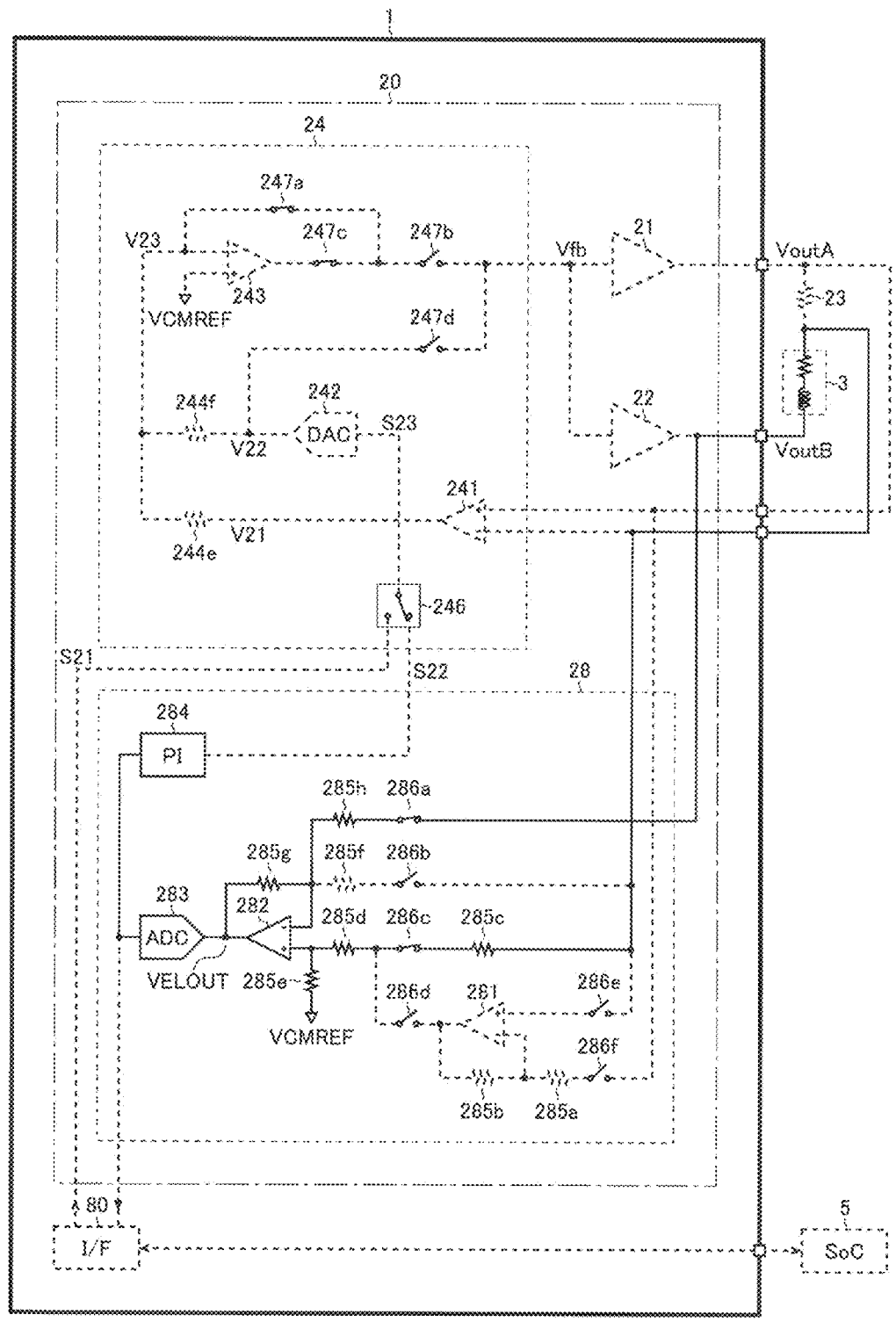
FIG. 10 is a circuit diagram showing a state of circuit connection during discontinuous speed control (OFF period Toff).

FIG. 10 is a circuit diagram showing a state of inside circuit connection of the voice coil motor driver 20 during the discontinuous speed control (OFF period Toff) of the voice coil motor 3. In the FIG. 10, solid lines show active signal paths, and dashed lines show inactive signal paths.

During the OFF period Toff of the voice coil motor 3, the switches 286b, 286d, 286e, and 286f are turned off (open circuit) and the switches 286a and 286c are turned on (short circuit) in the back electromotive force monitoring circuit 28. According to the above-mentioned switching control, the back electromotive force monitoring circuit 28 generates the speed detection voltage VELOUT in accordance with the motor speed (head speed) in a state where the voice coil motor 3 is stopped.

Besides, during the discontinuous speed control of the voice coil motor 3, the output signal of the A/D converter 283 is outputted to the PI calculator 284 in the back electromotive force monitoring circuit 28. According to such output switching control, the PI calculator 284 performs the PI calculation to the output signal (the digital signal on accordance with the speed detection voltage VELOUT) of the A/D converter 283, and consequently it is possible to generate the second motor control signal S22.

On the other hand, in the OFF period Toff of the voice coil motor 3, the driver circuits 21 and 22 becomes a high impedance state, and the output feedback circuit 24 is invalidated.

<Operational Amplifier>

Figure 11:
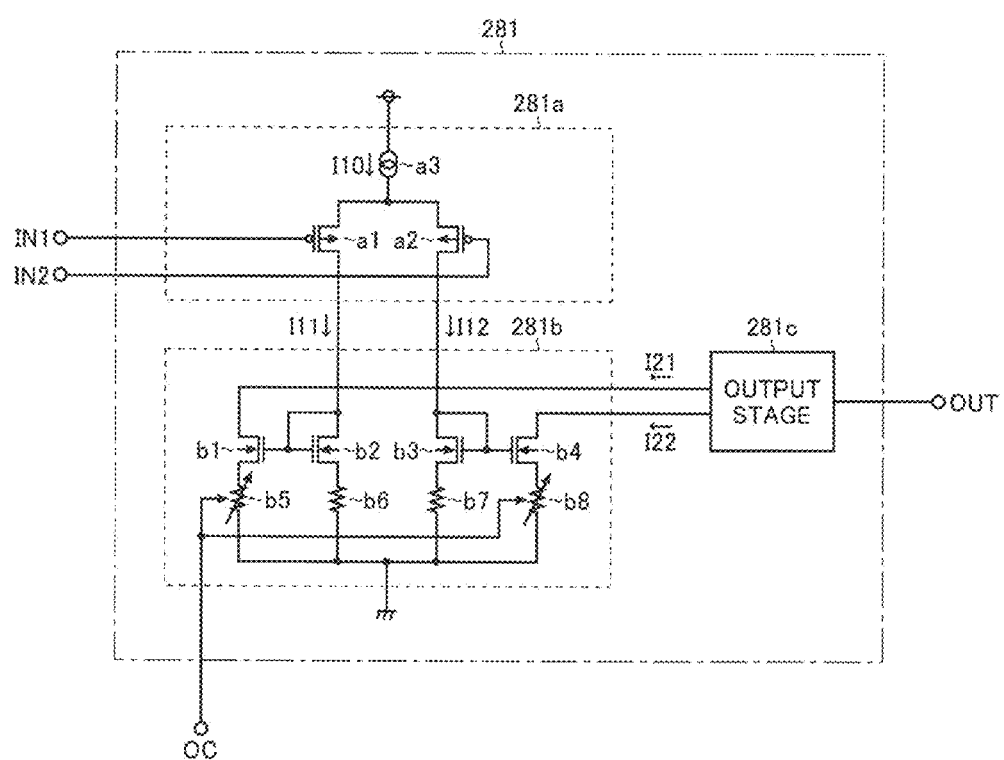
FIG. 11 is a circuit diagram showing a first structural example of an operational amplifier 281.

FIG. 11 is a circuit diagram showing a first structural example of an operational amplifier 281. The operational amplifier 281 in the first structural example includes an input stage 281a, an offset adjuster 281b, and an output stage 281c. Here, because it is possible to adopt the similar structure as the operational amplifier 281 in operational amplifier 282, a duplicate description of the structure is therefore omitted.

The input stage 281a is a circuit block which generates input currents I11 and I12 in accordance with input signals IN1 and IN2, and includes P-channel type MOS field effect transistors a1 and a2 (hereinafter, referred to as PMOSFETs [P-channel type metal oxide semiconductor field effect transistors] a1 and a2) and a current source a3. Sources of the PMOSFETs a1 and a2 are connected to the current source a3 which generates a constant current I10. A Gate of the PMOSFET a1 is connected to an application terminal of the input signal IN1. A Gate of the PMOSFET a2 is connected to an application terminal of the input signal IN2. Drains of the PMOSFETs a1 and a2 are connected to the offset adjuster 281b as output terminals of the input currents I11 and I12 respectively.

The offset adjuster 281b is a circuit block which gives each of offsets to the input currents I11 and I12 to generate output currents I21 and I22, and includes N-channel type MOS field effect transistors b1 to b4 (hereinafter, referred to as NMOSFETs [N-channel type MOSFETs] b1 to b4) and resistors b5 to b8.

Drains of the NMOSFETs b1 and b4 are connected to the output stage 281c as output terminals of the output current I21 and I22. Drains of the NMOSFETs b2 and b3 are connected to the input stage 281a as input terminals of the input currents I11 and I12. Gates of the NMOSFETs b1 and b2 are connected to the drain of the NMOSFETs b2. Gates of the NMOSFETs b3 and b4 are connected to the drain of the NMOSFETs b3. Sources of the NMOSFETs b1 to b4 are connected to a ground terminal via the resistors b5 to b8 respectively. Resistance values of the resistors b5 and b8 is variable in accordance with an offset adjustment signal OC (e.g., 10-bit). On the other hand, resistance values of resistors b6 and b7 are fixed.

The output stage 281c is a circuit block which generates an output signal OUT in accordance with the output currents I21 and I22.

In the operational amplifier 281 having the above structure, in case of "IN1<IN2", "I11>I12" is satisfied because a lot of the constant current I10 generated by the current source a3 flows into the PMOSFET a1 rather than into the PMOSFET a2. To the contrary, in case of "IN1>IN2", "I11<I12" is satisfied because a lot of the constant current I10 flows into the PMOSFET a2 rather than into the PMOSFET a1.

The Transistors b1 and b2, and the transistors b3 and b4 respectively form current mirrors. When all the resistance values of resistors b5 to b8 are equal, the input currents I11 and I12 are mirrored out as the output currents I21 and I22. Accordingly, relative voltage relation to the output currents I21 and I22 corresponds with relative voltage relation to the input currents I11 and I12.

On the other hand, if the difference in the resistance values of the resistors b5 and b8 is given in accordance with the offset adjustment signal OC, the relative voltage relation to the output currents I21 and I22 does not correspond with the relative voltage relation to the input currents I11 and I12. For example, when the resistance value of the resistor b5 is higher than the resistance value of the resistor b8, each of the offsets is given to the input currents I11 and I12 so as to decrease the output current I21 and increase the output current I22. To the contrary, when the resistance value of the resistor b8 is higher than the resistance value of the resistor b5, each of the offsets is given to the input currents I11 and I12 so as to increase the output current I21 and decrease the output current I22.

According to the operational amplifier 281 of the first structural example, it is possible to perform the offset adjustment with variation of pairing property of the current mirror by adjusting each of the resistance values of the resistors b5 and b8 in accordance with the offset adjustment signal OC.

However, the resistance values of the resistors b5 and b8 have to be adjusted closely in order to achieve multi-gradation (multi-bit) of the offset adjustment. Therefore, because the operational amplifier 281 in the first structural example needs a lot of resistance elements to form the resistors b5 and b8, there is a problem that increase of a circuit scale is liable to be brought. Besides, because a discontinuity point of an offset adjustment voltage Vd occurs in the operational amplifier 281 in the first structural example during a carry or a borrow of the offset adjustment signal OC, there is a problem that linearity of the offset adjustment is difficult to be maintained.

Figure 12:
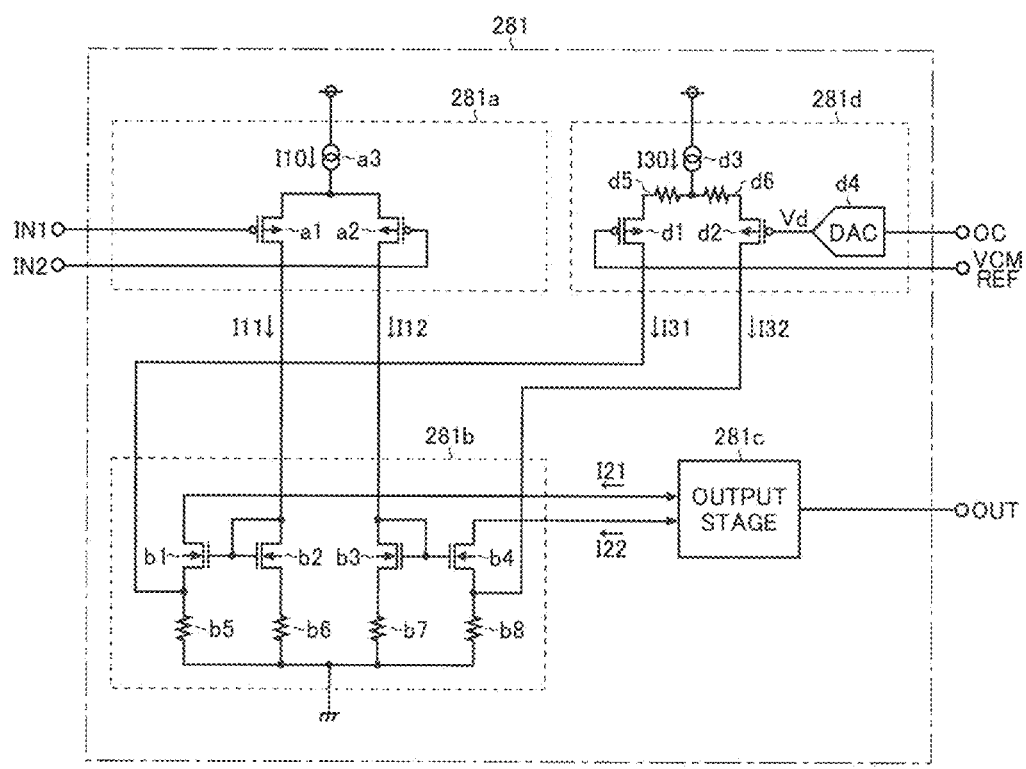
FIG. 12 is a circuit diagram showing a second structural example of an operational amplifier 281.

FIG. 12 is a circuit diagram showing a second structural example of an operational amplifier 281. The operational amplifier 281 in the second structural example is an improved operational amplifier of the first structural example. Besides, FIG. 12 fixes each of the resistance values of the resistors b5 to b8 included in the offset adjuster 281b, and is structured so as to newly add an offset current generator 281d. Therefore, the same structural elements as the first structural example will leave out redundant explanation by giving the same reference numerals as FIG. 11. The following description is focused on characteristics of the second structural example.

The offset current generator 281d is a circuit block which generates offset currents I31 and I32 in accordance with the offset adjustment signal OC, and includes P-channel type MOS field effect transistors d1 and d2 (hereinafter, referred to as PMOSFETs d1 and d2), a current source d3, a D/A converter d4, and adjustment resistors d5 and d6.

Sources of the PMOSFETs d1 and d2 are connected to the current source d3 for generating a constant current I30 via the adjustment resistors d5 and d6 respectively. A Gate of the PMOSFET d1 is connected to the application terminal of the reference voltage VCMREF. A Gate of the PMOSFET d2 is connected to an output terminal of the D/A converter d4 (an application terminal of the offset adjustment voltage Vd). An input terminal of the D/A converter d4 is connected to an application terminal of the offset adjustment signal OC (e.g., 10-bit). Drains of the PMOSFETs d1 and d2 are connected to the offset adjuster 281b as output terminals of the offset currents I31 and I32 respectively. More specifically, the drain of the PMOSFET d1 is connected to a connection node between the transistor b1 and the resistor b5, and besides, the drain of the PMOSFET d2 is connected to a connection node between the transistor b4 and the resistor b8.

Figure 13:
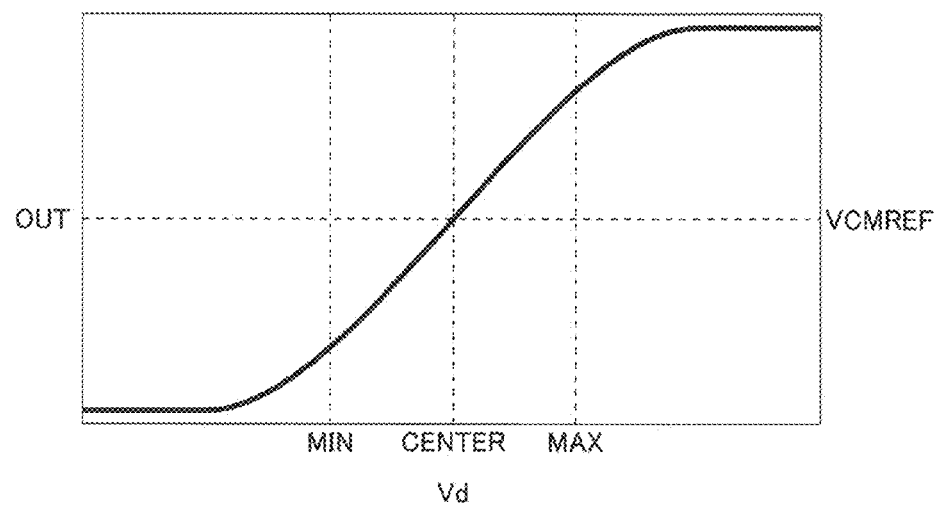
FIG. 13 is a correlation diagram between an output of a DAC and an output of an operational amplifier.

In the offset current generator 281d having the above structure, the D/A converter d4 convert the offset adjustment signal OC into an analog signal to generate the offset adjustment voltage Vd. More specifically, the D/A converter d4, as shown in FIG. 13, performs D/A conversion processing of the offset adjustment signal OC so that a median of the offset adjustment voltage Vd can correspond with the reference voltage VCMREF.

Besides, the PMOSFETs d1 and d2, the current source d3, and the adjustment resistor d5 and d6 function as an offset current generation stage which generates the offset currents I31 and I32 in accordance with the reference voltage VCMREF and the offset adjustment voltage Vd.

In the operational amplifier 281 in the second structural example, in case of "VCMREF<Vd", "I31>I32" is satisfied because a lot of the constant current I30 generated by the current source d3 flows into the PMOSFET d1 rather than into the PMOSFET d2. To the contrary, in case of "VCMREF>Vd", "I31<I32" is satisfied because a lot of the constant current I30 flows into the PMOSFET d2 rather than into the PMOSFET d1. Besides, in case of "VCMREF=Vd", "I31=I32" is satisfied because the constant current I30 is equally divided to the PMOSFETs d1 and d2.

The transistors b1 and b2, and the transistors b3 and b4 form current mirrors respectively. If a current value of the offset current I31 is equal to a current value of the offset current I32, relative voltage relation to the output currents I21 and I22 corresponds with relative voltage relation to the input currents I11 and I12 because all the resistance values of the resistors b5 to b8 are equal.

On the other hand, if the difference in the current values of the offset currents I31 and I32 is given in accordance with the offset adjustment signal OC, the relative voltage relation to the output currents I21 and I22 doesn't corresponds with the relative voltage relation to the input currents I11 and I12. For example, in case of "I31>I32", each of the offsets is given to the input currents I11 and I12 so as to decrease the output current I21 and increase the output current I22. To the contrary, in case of "I31<I32", each of the offsets is given to the input currents I11 and I12 so as to increase the output current I21 and decrease the output current I22.

As the above description, in the operational amplifier 281 in the second structural example, the offset adjuster 281b generates the output currents I21 and I22 by providing each of the offsets for the input currents I11 and I12 using the offset currents I31 and I32. According to such a structure, it is possible to achieve multi-gradation (multi-bit) of the offset adjustment without bringing the increase of the circuit scale unlike the first structural example. Besides, the operational amplifier 281 in the second structural example maintains the linearity of the offset adjustment more easily than the first structural example.

According to the operational amplifier 281 in the second structural example, it is possible to finely adjust offset sensitivity (degree of variation of the output signal OUT to the offset adjustment voltage Vd) optionally because the current values of the offset currents I11 and I12 can be increased and decreased using the adjustment resistors d5 and d6 of the offset current generator 281d. Therefore, it is possible to optimize the offset sensitivity to a variable range of the offset adjustment voltage Vd (output dynamic range of the D/A converter d4) so as to be able to secure the linearity of the output signal OUT (the output of the amplifier).

<PI Calculator>

Figure 14:
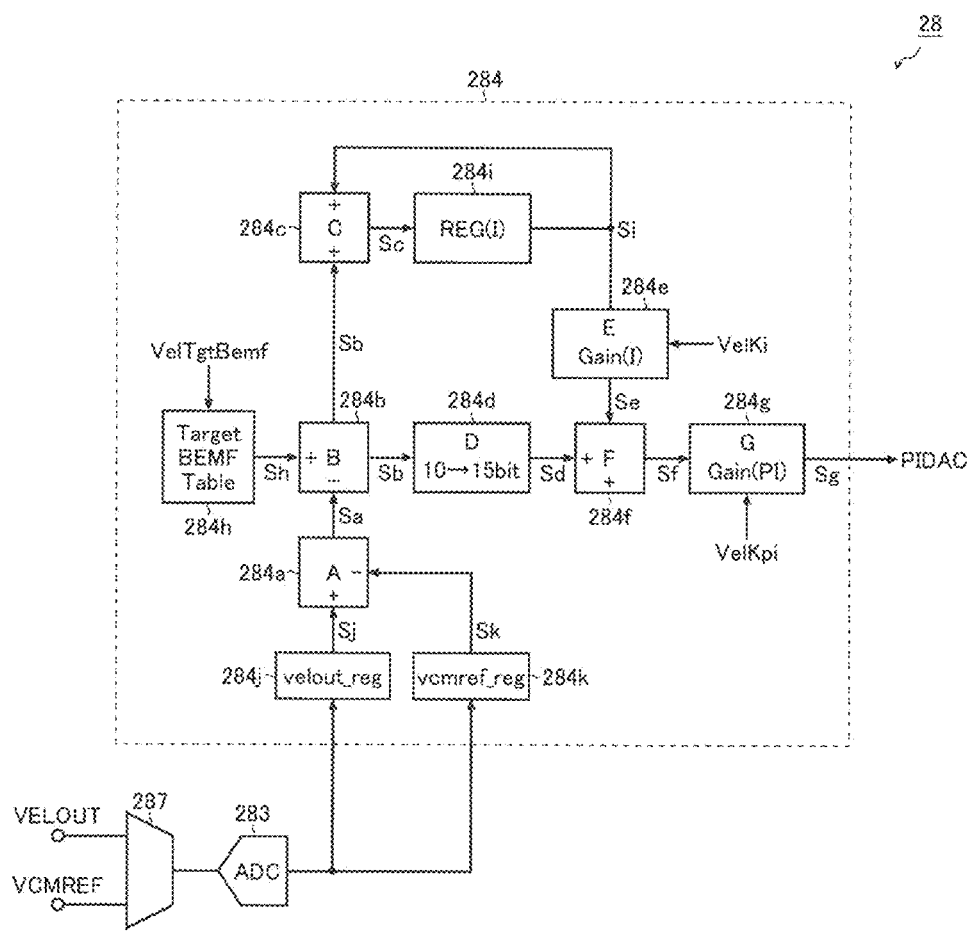
FIG. 14 is a circuit diagram showing a structural example of a PI calculator 284.

FIG. 14 is a circuit diagram showing a structural example of a PI calculator 284 (and the periphery thereof). The PI calculator 284 in the present structural example is a digital calculator which treats digital signals, and includes subtracters 284a and 284b, an adder 283c, a bit converter 284d, an amplifier 284e, an adder 284f, an amplifier 284g, a target value table 284h, and registers 284i, 284j and 284k.

Besides, back electromotive force monitoring circuit 28 in the present structural example includes a selector 287 which outputs the speed detection voltage VELOUT and the reference voltage VCMREF in turn by time division as a structural element which is not shown in FIG. 6. The A/D converter 283 converts voltages outputted from the selector 287 in turn into digital signals respectively to output the digital signals to the PI calculator 284.

The subtracter 284a subtracts a digital signal Sk (register value: vcmref_reg) from a digital signal Sj (register value: velout_reg) to generate a digital signal Sa (register value: vel_reg=velout_reg−vcmref_reg).

The subtracter 284b subtracts the digital signal Sa (register value: vel_reg) from a digital signal Sh (register value: tgtbemf_reg) to generate a digital signal Sb (register value: velcalc_reg=tgtbemf_reg−vel_reg).

The adder 284c adds the digital signal Sb (register value: velcalc_reg) to a digital signal Si (register value: velcalc_ireg (last calculation results)) to generate a digital signal Sc (register value: velcalc_ireg (this calculation results)).

The bit converter 284d converts the 10-bit digital signal Sb (register value: velcalc_reg) into a 15-bit digital signal Sd (register value: velcalc_reg15<<5).

The amplifier 284e amplifies the digital signal Si (register value: velcalc_ireg) with a predetermined gain (Gain(I)) to generate a digital signal Se (register value: i_reg= velcalc_ireg*Gain(I)). Here, the gain (Gain(I)) is set by a 3-bit gain setting signal (VelKi[2:0]).

The adder 284f adds the digital signal Sd (register value: velcalc_reg15) to the digital signal Se (i_reg) to generate a digital signal Sf (register value: picalc1).

The amplifier 284g amplifies the digital signal Sf (register value: picalc1) with a predetermined gain (Gain(PI)) to generate a digital signal Sg (register value: PIDAC=picalc1*Gain (PI)) and output the digital signal Sg as the motor control signal S22. Here, the gain (Gain(PI)) is set by a 3-bit gain setting signal (VelKpi[2:0]).

The target value table 284h outputs 16 digital signals Sh (register value: tgtbemf_reg) in accordance with a 4-bit target setting signal (register value: VelTgtBemf).

The register 284i stores the digital signal Sc (register value: velcalc_ireg) to output the digital signal Sc as the digital signal Si (register value: velcalc_ireg). In other words, the register 284i holds the last calculation results until the register value (velcalc_ireg) is updated.

The register 284j stores the digital signal Sj (register value: velout_reg) in accordance with the speed detection voltage VELOUT.

The register 284k stores the digital signal Sk (register value: vcmref_reg) in accordance with the reference voltage VCMREF.

Figure 15:
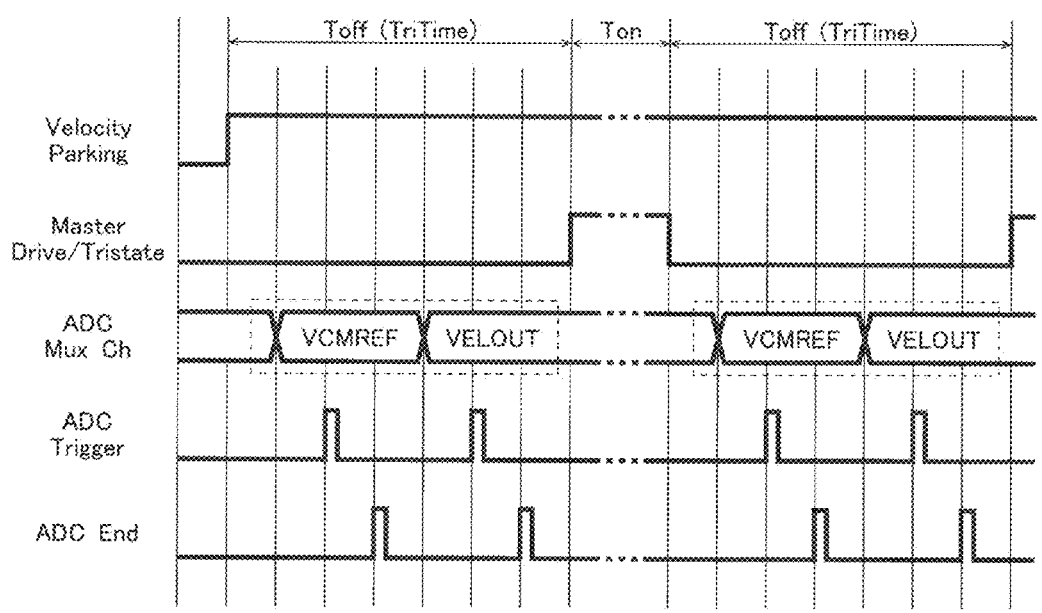
FIG. 15 is a detailed timing chart showing an example of discontinuous speed control.

FIG. 15 is a detailed timing chart showing an example of discontinuous speed control, and describes a power supply interruption flag (Velocity Parking) an operation state of the voice coil motor driver 20 (Master Drive/Tristate), a selection state of the selector (ADC Mux Ch), an A/D conversion start trigger (ADC Trigger), and an A/D conversion end trigger (ADC End), in order from top.

The power supply interruption flag (Velocity Parking) is an enabling signal of the PI calculator 284, and is a high level (a logical level during enabling) during the power supply interruptions. In other words, the motor drive device 1 performs the discontinuous speed control of the voice coil motor 3 by enabling the PI calculator 284 to operate the magnetic head at the predetermined speed safely when the power off retraction of the magnetic head is performed during the power supply interruptions.

As shown in FIG. 8, the ON period Ton and the OFF period Toff (the high impedance period of the voice coil motor driver 20) of the voice coil motor 3 are repeated alternately during the discontinuous speed control of the voice coil motor 3. At that time, the back electromotive force monitoring circuit 28 detects the back electromotive force BEMF of the voice coil motor 3 every OFF period Toff of the voice coil motor 3 to generate the second motor control signal S22.

In particular, the back electromotive force monitoring circuit 28 calculates a difference value between the speed detection voltage VELOUT and the reference voltage VCMREF every OFF period Toff of the voice coil motor 3 to generate the second motor control signal S22 from the calculation results thereof.

More specifically, during the OFF period of the voice coil motor 3, the selector 287 selects the reference voltage VCMREF, and then, the A/D conversion start trigger is raised. Consequently, the A/D conversion processing of the reference voltage VCMREF is started. When the A/D conversion end trigger is raised, an A/D conversion result of the reference voltage VCMREF is stored as the register value (vcmref_reg) to the register 284k.

Next, the selector 287 selects the speed detection voltage VELOUT, and then, the A/D conversion start trigger is raised. Consequently, the A/D conversion processing of the speed detection voltage VELOUT is started. When the A/D conversion end trigger is raised, an A/D conversion result of the speed detection voltage VELOUT is stored as the register value (velout_reg) to the register 284j.

After the above-mentioned data are stored to the register 284j and the register 284k, the above-mentioned PI calculator 284 is performed before the voice coil motor 3 is switched to the ON period Ton, and then, the second motor control signal S22 is generated.

On the other hand, the output feedback circuit 24 generates the feedback voltage Vfb from the second motor control signal S22 every ON period Ton of the voice coil motor 3. Accordingly, the output feedback control of the voice coil motor 3 is performed so as to move the magnetic head at predetermined speed in accordance with PI calculation results in the output feedback circuit 24.

Before the second motor control signal S22 is generated, the PI calculator 284 subtracts the reference voltage VCMREF from the speed detection voltage VELOUT using the subtracter 284a. Accordingly, if the reference voltage VCMREF varies under the influence of noise or the like, it is possible to accurately control the motor speed (head speed) because a variation component thereof can be cancelled in advance.

In particular, during the power supply interruptions, the noise is easy to be superimposed on the reference voltage VCMREF generated from the power voltage VPWR because the power voltage VPWR is generated by rectifying the phase voltages, one for each phase, generated during idling of the spindle motor 2. Under the above conditions, it is possible to operate the magnetic head at the predetermined speed safely because the variation component of the reference voltage VCMREF can be cancelled, and then, the predetermined motor speed (head speed) can be maintained in the back electromotive force monitoring circuit 28 in the present structure.

However, when not only the power supply is interrupted but also the PI calculator 284 is enabled, it is advisable to perform the PI calculation in accordance with the difference value between the reference voltage VCMREF and the speed detection voltage VELOUT. As the above description, it is possible to perform the PI calculation correctly even if unintended variation occurs to the reference voltage VCMREF for some reasons.

Besides, it is not always necessary to use a digital calculator as a calculator for generating the second motor control signal S22 in accordance with the speed detection voltage VELOUT. For example, it is possible to use an analog calculator as the above-mentioned calculator.

<Application to Hard Disk Drive>

Figure 16:
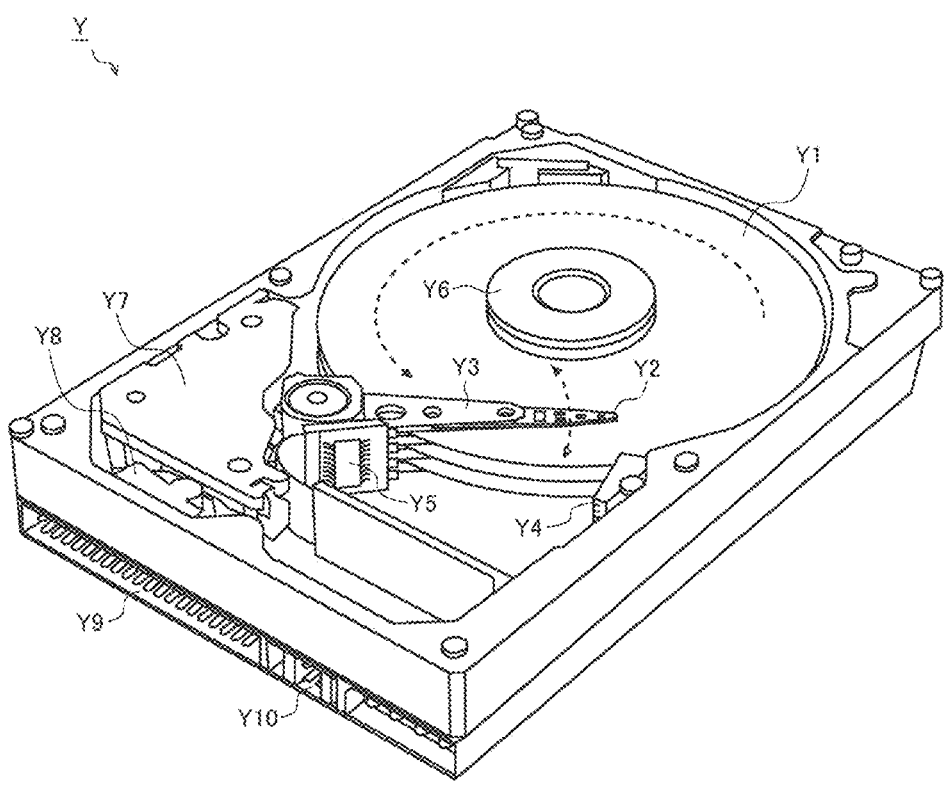
FIG. 16 is a perspective view showing a structural example of a hard disk drive provided with a motor drive device.

FIG. 16 is a perspective view (with a top cover removed) showing a structural example of a hard disk drive that incorporates the motor drive device. A hard disk drive Y in the present structural example is a kind of magnetic disk storage device and has: a platter Y1; a magnetic head Y2; a swing arm Y3; a lamp mechanism Y4; a head amplifier Y5; a spindle motor Y6; a voice coil motor Y7; a latch mechanism Y8; an interface connector Y9; and a jumper switch Y10.

The platter Y1 is a magnetic disk that is formed by laminating a magnetic layer on a surface of an aluminum board or a glass board. One hard disk drive Y incorporates one to four platters Y1.

The magnetic head Y2 reads and writes data to and from the platter Y1.

The swing arm Y3 holds the magnetic head Y2 at a tip end thereof.

The lamp mechanism Y4 is an evacuation place for the magnetic head Y2 during a time the platter Y1 does not rotate, and is disposed further outside an outermost circumference of the platter Y1.

The head amplifier Y5 amplifies a regenerative signal obtained by the magnetic head Y2.

The spindle motor Y6 (corresponding to the spindle motor 2 in FIG. 1) rotates the platter Y1 at predetermined rotation speeds (4200 rpm, 5400 rpm, 7200 rpm, 10000 rpm, 15000 rpm and the like).

The voice coil motor Y7 (corresponding to the voice coil motor 3 in FIG. 1) moves the swing arm Y3 in an arc, thereby moving the magnetic head Y2 in a radial direction of the platter Y1.

The latch mechanism Y8 holds the swing arm Y3 during a time the hard disk drive Y is stopped.

The interface connector Y9 is connected to a host interface circuit, which is mounted on a mother board of a personal computer and the like, over a cable.

The jumper switch Y10 is a switch for performing the machine setting (master/slave and the like) of the hard disk drive Y by means of a jumper pin when connecting a plurality of the hard disk drives to one personal computer.

Here, though not shown in FIG. 16, the hard disk drive Y is provided with a printed board on which the microcomputer (Soc) and various electronic circuits are mounted. The motor drive device 1 in FIG. 1 is mounted on the above-mentioned printed board as a means for driving the spindle motor Y6 and the voice coil motor Y7.

<Application to Desktop Personal Computer>

Figure 17:
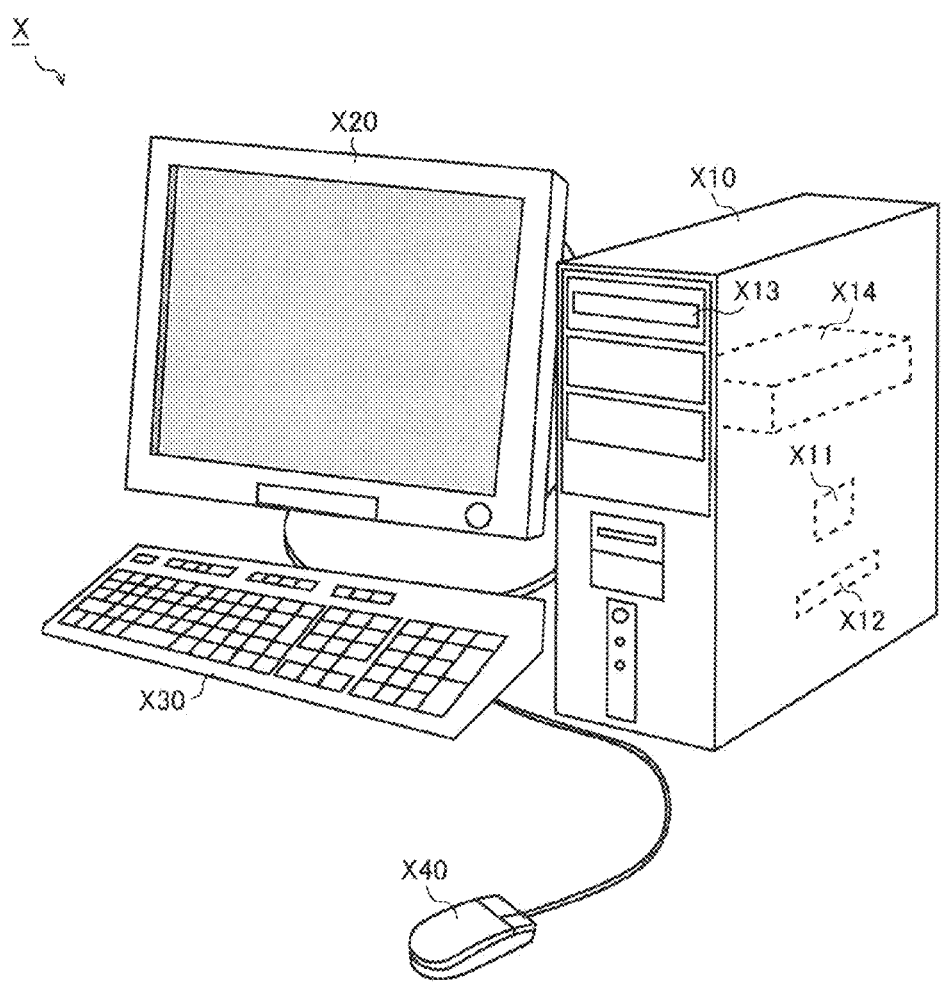
FIG. 17 is an appearance view showing a structural example of a personal computer that incorporates a hard disk drive.

FIG. 17 is an appearance view showing a structural example of a desktop personal computer that incorporates the hard disk drive. A desktop personal computer X in the present structural example has: a main body case X10; a liquid crystal monitor X20; a keyboard X30; and a mouse X40.

The main body case X10 houses: a central processing unit X11; a memory X12; an optical drive X13; a hard disk drive X14 and the like.

The central processing unit X11 executes an operating system and various application programs stored in the hard disk drive X14, thereby controlling comprehensively operation of the desktop personal computer X.

The memory X12 is used as a working region (e.g., a region for storing task data when executing a program) for the central processing unit X11.

The optical drive X13 performs reading/writing of data to and from an optical disk. As the optical disk, there are a CD [compact disk], a DVD [digital versatile disc], a BD [Blu-ray disc] and the like.

The hard disk drive X14 (corresponding to the hard disk drive Y in FIG. 16) is a large-capacity auxiliary storage device that stores the programs and data in a non-volatile way by means of a magnetic disk sealed tightly in the housing.

The liquid crystal monitor X20 outputs an image based on an instruction from the central processing unit X11.

The keyboard X30 and the mouse X40 are each a human interface device that accepts operation by a user.

<Summary>

Hereinafter, the invention described in the specification can be summarized.

First Invention

In the invention described in the present specification, an A/D converter of a first invention comprises: an analog multiplexer stage which selects one of a plurality of first analog signals as a second analog signal; an amplifier stage which amplifies the second analog signal to generate a third analog signal; an A/D conversion stage which converts the third analog signal into a digital signal; and a sequencer which controls those stages, wherein the sequencer performs input switching processing in the analog multiplexer stage on completion of sample hold processing by the A/D conversion stage, when performing a plurality of times of A/D conversion processing sequentially, without waiting for completion of the A/D conversion processing (structure 1-1).

In the A/D converter of the structure 1-1, the A/D conversion stage is a successive approximation type (structure 1-2).

In the A/D converter of the structure 1-1, the sequencer performs the input switching processing of the analog multiplexer stage every the plurality of times of the A/D conversion processing (structure 1-3).

In the A/D converter of the structure 1-1, the sequencer performs the gain switching processing of the amplifier stage every the plurality of times of the A/D conversion processing (structure 1-4).

In the A/D converter of the structure 1-4, the amplifier stage has a signal path which outputs the second analog signal as the third analog signal without being subjected to any process (structure 1-5).

In the A/D converter of the structure 1-1, the sequencer performs only the number of times of the designated A/D conversion processing sequentially (structure 1-6).

In the A/D converter of the structure 1-1, the sequencer operates in synchronization with a clock signal of a predetermined frequency (structure 1-7).

In the A/D converter of the structure 1-1, the sequencer sets total processing time of the second time or later shorter than total processing time of the first time when performing a plurality of times of A/D conversion processing sequentially (structure 1-8).

A motor drive device of the first invention comprises: a motor driver which drives a motor; a logic unit which controls entire operation of the motor drive device comprehensively; and an A/D converter according to the structure 1-1, which changes an analog signal into a digital signal to output the digital signal to the logic unit (structure 1-9).

The motor drive device of the structure 1-9 further comprises a register which stores data in a volatile manner, wherein the logic unit stores a series of digital signals generated by the A/D converter into the register (structure 1-10).

The motor drive device of the structure 1-10 further comprises a serial interface which performs serial communication with a microcomputer located to the outside of the motor drive device, wherein a series of the digital signals is read by the microcomputer (structure 1-11).

A magnetic disk storage device of the first invention comprises: a platter; a magnetic head which reads and writes data to and from the platter; a swing arm which holds the magnetic head at a tip end thereof; a spindle motor which rotates the platter; a voice coil motor which moves the swing arm in an arc; a motor drive device according to the 1-9 structure, which drives the spindle motor and the voice coil motor; and a microcomputer which controls entire operation of the magnetic disk storage device (1-12 structure).

An electronic appliance of the first invention comprises the magnetic disk storage device according to the structure 1-12 (structure 1-13).

[Second Invention]

In the invention described in the present specification, an operational amplifier of a second invention comprises: an input stage which generates a first input current and a second input current in accordance with a first input signal and a second input signal; an offset adjuster which gives offsets to the first input current and the second input current respectively to generate a first output current and a second output current; an output stage which generates an output signal in accordance with the first output current and the second output current; and an offset current generator which generates a first offset current and a second offset current in accordance with an offset adjustment signal, wherein the offset adjuster gives the offsets to the first input current and the second input current respectively by using the first offset current and the second offset current (structure 2-1).

In the operational amplifier of the structure 2-1, the offset current generator includes: a D/A converter which generates an offset adjustment voltage from the offset adjustment signal; and an offset current generation stage which generates the first offset current and the second offset current in accordance with a predetermined reference voltage and the offset adjustment voltage (structure 2-2).

In the operational amplifier of the structure 2-2, the D/A converter performs D/A conversion processing of the offset adjustment signal so that a median of the offset adjustment voltage can correspond with the reference voltage.

In the operational amplifier of the structure 2-2, the offset current generation stage includes: a current source which generates a constant current; a first PMOSFET having a gate which is connected to an application terminal of the reference voltage, a source which is connected to the current source, and a drain which is connected to an output terminal of the first offset current; and a second PMOSFET having a gate which is connected to an application terminal of the offset adjustment voltage, a source which is connected to the current source, and a drain which is connected to an output terminal of the second offset current (structure 2-4).

In the operational amplifier of the structure 2-4, the offset current generation stage further includes: adjustment resistors are connected between each of sources of the first PMOSFET and the second PMOSFET and the current source (structure 2-5).

In the operational amplifier of the structure 2-1, the offset adjuster includes: first to fourth NMOSFETs; and first to fourth resistors, wherein a drain of the first NMOSFET is connected to an output terminal of the first output current, a drain of the second NMOSFET is connected to an input terminal of the first input current, a drain of the third NMOSFET is connected to an input terminal of the second input current, a drain of the first NMOSFET is connected to an output terminal of the second output current, gates of the first NMOSFET and the second NMOSFET are connected to the drain of the second NMOSFET, gates of the third NMOSFET and the fourth NMOSFET are connected to the drain of the third NMOSFET, a first terminal of the first resistor is connected to the source of the first NMOSFET and an input terminal of the first offset current, a first terminal of the second resistor is connected to the source of the second NMOSFET, a first terminal of the third resistor is connected to the source of the third NMOSFET, a first terminal of the fourth resistor is connected to the source of the fourth NMOSFET and an input terminal of the second offset current, and each of the second terminals of the first to fourth resistors are connected to a ground terminal (structure 2-6).

In the operational amplifier of the structure 2-6, resistance values of the first to fourth resistors are fixed (structure 2-7).

A motor drive device of the second invention comprises a voice coil motor driver which drives a voice coil motor, wherein the voice coil motor driver includes: a driver circuit which generates an output current to the voice coil motor; an output feedback circuit which monitors the output current to generate a feedback voltage to the driver circuit; and a back electromotive force monitoring circuit which monitors a back electromotive force generated by the voice coil motor to generate a speed detection voltage, wherein the back electromotive force monitoring circuit includes an operational amplifier according to the structure 2-1 and generates the speed detection voltage by the operational amplifier (structure 2-8).

In the motor drive device of the structure 2-8, the back electromotive force monitoring circuit further includes an A/D converter which changes the speed detection voltage into a digital signal (structure 2-9).

The motor drive device of the structure 2-9 further comprises a serial interface which performs serial communication with a microcomputer located to the outside of the motor drive device, wherein the digital signals is read by the microcomputer (structure 2-10).

In the motor drive device of the structure 2-10, the output feedback circuit includes: a differential amplifier which generates a first voltage in accordance with the output current; a D/A converter which changes a motor control signal inputted from the microcomputer into a second voltage; and an error amplifier which amplifies a difference between a third voltage based on both the first voltage and the second voltage and a predetermined reference voltage to generate the feedback voltage (structure 2-11).

In the motor drive device of the structure 2-8, the driver circuit includes: an output transistor; a linear driver which continuously varies a gate voltage of the output transistor based on the feedback voltage; and a pre-driver which periodically switches the gate voltage of the output transistor to a high level or a low level when the driver circuit is in a PWM drive state and is separated from the gate of the output transistor when the driver circuit is in a linear drive state (structure 2-12).

The motor drive device of the structure 2-8 further comprises a spindle motor driver which drives a spindle motor (structure 2-13).

A magnetic disk storage device of the second invention comprises: a platter; a magnetic head which reads and writes data to and from the platter; a swing arm which holds the magnetic head at a tip end thereof; a spindle motor which rotates the platter; a voice coil motor which moves the swing arm in an arc; a motor drive device according to the structure 2-13, which drives the spindle motor and the voice coil motor; and a microcomputer which controls entire operation of the magnetic disk storage device comprehensively (structure 2-14).

An electronic appliance of the second invention comprises the magnetic disk storage device according to the structure 2-14 (structure 2-15).

Third Invention

In the invention described in the present specification, a back electromotive force monitoring circuit of a third invention comprises: a speed detection voltage generator which biases a back electromotive force generated by a voice coil motor with a predetermined reference voltage to generate a speed detection voltage; and a calculator which generates a motor control signal in accordance with the speed detection voltage, wherein the calculator includes a subtracter which subtracts the reference voltage from the speed detection voltage prior to generation of the motor control signal (structure 3-1).

The back electromotive force monitoring circuit of the structure 3-1 further comprises: a selector which outputs the speed detection voltage and the reference voltage in turn by time division; and an A/D converter which changes voltages outputted from the selector in turn into digital signals respectively to output the digital signals to the calculator, wherein the calculator is a digital calculator which treats the digital signals (structure 3-2).

In the back electromotive force monitoring circuit of the structure 3-2, the calculator includes: a first register which stores a first register value in accordance with the speed detection voltage; and a second register which stores a second register value in accordance with the reference voltage, wherein the subtracter performs difference processing between the first register and the second register (structure 3-3).

In the back electromotive force monitoring circuit of the structure 3-3, the calculator performs PI (proportinal/integral) calculation to an output signal of the subtracter to generate the second motor control signal (structure 3-4).

A motor drive device of the third invention comprises a voice coil motor driver which drives a voice coil motor, wherein the voice coil motor driver includes: a driver circuit which generates an output current to the voice coil motor; an output feedback circuit which monitors the output current to generate a feedback voltage to the driver circuit; a back electromotive force monitoring circuit according to the structure 3-4, which monitors a back electromotive force generated by the voice coil motor (structure 3-5).

In the motor drive device of the structure 3-5, the back electromotive force monitoring circuit generates the motor control signal based on a difference value between the speed detection voltage and the reference voltage every OFF period of the voice coil motor during discontinuous speed control of the voice coil motor, and the output feedback circuit generates the feedback voltage from the motor control signal every ON period of the voice coil motor during the discontinuous speed control of the voice coil motor (structure 3-6).

In the motor drive device of the structure 3-6, the driver circuit includes: an output transistor; a linear driver which continuously varies a gate voltage of the output transistor based on the feedback voltage; and a pre-driver which periodically switches the gate voltage of the output transistor to a high level or a low level when the driver circuit is in a PWM drive state and is separated from the gate of the output transistor when the driver circuit is in a linear drive state (structure 3-7).

The motor drive device of the structure 3-7 further comprises a spindle motor driver which drives a spindle motor (structure 3-8).

A magnetic disk storage device of the third invention comprises a platter; a magnetic head which reads and writes data to and from the platter; a swing arm which holds the magnetic head at a tip end thereof; a spindle motor which rotates the platter; a voice coil motor which moves the swing arm in an arc; a motor drive device according to the structure 3-8, which drives the spindle motor and the voice coil motor; and a microcomputer which controls entire operation of the magnetic disk storage device comprehensively (structure 3-9).

In the magnetic disk storage device of the structure 3-10, the motor drive device performs discontinuous speed control of the voice coil motor during power off retraction of the magnetic head (structure 3-10).

An electronic appliance of the third invention comprises the magnetic disk storage device according to the structure 3-10 (structure 3-11).

Other Modifications

In the above embodiments, a hard disk drive is given as an example of applications which incorporate the motor drive device. Besides, it is possible to incorporate the motor drive device into the applications other than the hard disk drive.

In addition, in the above embodiments, a desktop personal computer is given as an example of electronic appliances which incorporate the hard disk drive. Besides, it is possible to incorporate the hard disk drive into the electronic appliances (laptop computers, tablet personal computers, hard disk recorders, audio players, game machines and the like) other than the desktop personal computer.

Besides, in addition to the above embodiments, it is possible to add various modifications to the invention disclosed in the present specification without departing the spirit of the technological creation. In other words, it should be understood that the above embodiments are examples in all respects and are not limiting, the technological scope of the present invention is not indicated by the above embodiments but by the claims, and all modifications within the scope of the claims and the meaning equivalent to the claims are covered.

INDUSTRIAL APPLICABILITY

The invention disclosed in the present specification is usable, for example, as a system motor driver IC for a HDD [hard disk drive] controller.

LIST OF REFERENCE NUMERALS 1 motor drive device
2 spindle motor
3 voice coil motor
3a coil
3b resistance component
4 capacitor
5 microcomputer (SoC)
10 spindle motor driver
30 voice coil motor driver
21, 22 driver circuits
211, 221 output transistors (upper side)
212, 222 output transistors (lower side)
213, 223 linear drivers
214, 215, 224, 225 pre-drivers
23 sense resistor
24 output feedback circuit
241 operational amplifier
242 D/A converter
243 error amplifier
244a to 244g resistors
245 capacitor
246 selector
247a to 247d switches
25 PWM signal generation circuit
251 oscillator
252, 253 comparators
26 output voltage monitoring circuit
261, 262 comparators
27 control circuit
28 back electromotive force monitoring circuit
281, 282 operational amplifiers
281a input stage
a1, a2 P-channel type MOS field effect transistors
a3 current source
281b offset adjuster
b1 to b4 N-channel type MOS field effect transistors
b5 to b8 resistors
281c output stage
281d offset current generator
d1, d2 P-channel type MOS field effect transistors
d3 current source
d4 D/A converter
d5, d6 adjustment resistors
283 A/D converter
284 PI calculator
284a, 284b subtracters
284c, 284f adders
284d bit converter
284e, 284g amplifiers
284h target value table
284i, 284j, 284k registers
285a to 285h resistors
286a to 286f switches
287 selector
30 isolation switch (NMOSFET)
40 power voltage monitor
50 A/D converter
51 analog multiplexer stage
52 amplifier stage
53 A/D conversion stage
54 sequencer
60 logic unit
70 register
80 serial interface
L1 power supply line
X desktop personal computer
X10 main body case
X11 central processing unit
X12 memory X13 optical drive
X14 hard disk drive
X20 liquid crystal monitor
X30 keyboard
X40 mouse
Y hard disk drive
Y1 platter (magnetic disk)
Y2 magnetic head
Y3 swing arm
Y4 lamp mechanism
Y5 head amplifier
Y6 spindle motor
Y7 voice coil motor
Y8 latch mechanism
Y9 interface connector
Y10 jumper switch

What is claimed is:

1. An operational amplifier comprising:
an input stage which generates a first input current and a second input current in accordance with a first input signal and a second input signal;
an offset adjuster which gives offsets to the first input current and the second input current respectively to generate a first output current and a second output current;
an output stage which generates an output signal in accordance with the first output current and the second output current; and
an offset current generator which generates a first offset current and a second offset current in accordance with an offset adjustment signal, wherein
the offset adjuster gives the offsets to the first input current and the second input current respectively by using the first offset current and the second offset current, and
the offset adjuster includes:
first to fourth NMOSFETs; and
first to fourth resistors, wherein
a drain of the first NMOSFET is connected to an output terminal of the first output current,
a drain of the second NMOSFET is connected to an input terminal of the first input current,
a drain of the third NMOSFET is connected to an input terminal of the second input current,
a drain of the first NMOSFET is connected to an output terminal of the second output current,
gates of the first NMOSFET and the second NMOSFET are connected to the drain of the second NMOSFET,
gates of the third NMOSFET and the fourth NMOSFET are connected to the drain of the third NMOSFET,
a first terminal of the first resistor is connected to the source of the first NMOSFET and an input terminal of the first offset current,
a first terminal of the second resistor is connected to the source of the second NMOSFET,
a first terminal of the third resistor is connected to the source of the third NMOSFET,
a first terminal of the fourth resistor is connected to the source of the fourth NMOSFET and an input terminal of the second offset current, and
each of the second terminals of the first to fourth resistors are connected to a ground terminal.

2. The operational amplifier according to claim 1, wherein the offset current generator includes:
a D/A converter which generates an offset adjustment voltage from the offset adjustment signal; and
an offset current generation stage which generates the first offset current and the second offset current in accordance with a predetermined reference voltage and the offset adjustment voltage.

3. The operational amplifier according to claim 2, wherein the D/A converter performs D/A conversion processing of the offset adjustment signal so that a median of the offset adjustment voltage can correspond with the reference voltage.

4. The operational amplifier according to claim 2, wherein the offset current generation stage includes:
a current source which generates a constant current;
a first PMOSFET having a gate which is connected to an application terminal of the reference voltage, a source which is connected to the current source, and a drain which is connected to an output terminal of the first offset current; and
a second PMOSFET having a gate which is connected to an application terminal of the offset adjustment voltage, a source which is connected to the current source, and a drain which is connected to an output terminal of the second offset current.

5. The operational amplifier according to claim 4, wherein the offset current generation stage further includes:
adjustment resistors are connected between each of sources of the first PMOSFET and the second PMOSFET and the current source.

6. The operational amplifier according to claim 1, wherein resistance values of the first to fourth resistors are fixed.

7. A motor drive device comprising:
a voice coil motor driver which drives a voice coil motor, wherein
the voice coil motor driver includes:
a driver circuit which generates an output current to the voice coil motor;
an output feedback circuit which monitors the output current to generate a feedback voltage to the driver circuit; and
a back electromotive force monitoring circuit which monitors a back electromotive force generated by the voice coil motor to generate a speed detection voltage, wherein
the back electromotive force monitoring circuit includes an operational amplifier and generates the speed detection voltage by the operational amplifier, and
the operational amplifier comprises:
an input stage which generates a first input current and a second input current in accordance with a first input signal and a second input signal;
an offset adjuster which gives offsets to the first input current and the second input current respectively to generate a first output current and a second output current;
an output stage which generates an output signal in accordance with the first output current and the second output current; and
an offset current generator which generates a first offset current and a second offset current in accordance with an offset adjustment signal, wherein
the offset adjuster gives the offsets to the first input current and the second input current respectively by using the first offset current and the second offset current, and
the offset adjuster includes:
first to fourth NMOSFETs; and
first to fourth resistors, wherein
a drain of the first NMOSFET is connected to an output terminal of the first output current, a drain of the second NMOSFET is connected to an input terminal of the first input current, a drain of the third NMOSFET is connected to an input terminal of the second input current, a drain of the first NMOSFET is connected to an output terminal of the second output current, gates of the first NMOSFET and the second NMOSFET are connected to the drain of the second NMOSFET, gates of the third NMOSFET and the fourth NMOSFET are connected to the drain of the third NMOSFET, a first terminal of the first resistor is connected to the source of the first NMOSFET and an input terminal of the first offset current, a first terminal of the second resistor is connected to the source of the second NMOSFET, a first terminal of the third resistor is connected to the source of the third NMOSFET, a first terminal of the fourth resistor is connected to the source of the fourth NMOSFET and an input terminal of the second offset current, and each of the second terminals of the first to fourth resistors are connected to a ground terminal.

8. The motor drive device according to claim 7, wherein the back electromotive force monitoring circuit further includes:

an A/D converter which changes the speed detection voltage into a digital signal.

9. The motor drive device according to claim 8, further comprising:

a serial interface which performs serial communication with a microcomputer located to the outside of the motor drive device, wherein the digital signals is read by the microcomputer.

10. The motor drive device according to claim 9, wherein the output feedback circuit includes:

a differential amplifier which generates a first voltage in accordance with the output current;

a D/A converter which changes a motor control signal inputted from the microcomputer into a second voltage; and an error amplifier which amplifies a difference between a third voltage based on both the first voltage and the second voltage and a predetermined reference voltage to generate the feedback voltage.

11. The motor drive device according to claim 7, wherein the driver circuit includes:

an output transistor;

a linear driver which continuously varies a gate voltage of the output transistor based on the feedback voltage; and a pre-driver which periodically switches the gate voltage of the output transistor to a high level or a low level when the driver circuit is in a PWM drive state and is separated from the gate of the output transistor when the driver circuit is in a linear drive state.

12. The motor drive device according to claim 7, further comprising:

a spindle motor driver which drives a spindle motor.

13. A magnetic disk storage device comprising:

a platter;

a magnetic head which reads and writes data to and from the platter;

a swing arm which holds the magnetic head at a tip end thereof;

a spindle motor which rotates the platter;

a voice coil motor which moves the swing arm in an arc;

a motor drive device according to claim 12, which drives the spindle motor and the voice coil motor; and a microcomputer which controls entire operation of the magnetic disk storage device comprehensively.

14. An electronic appliance comprising:

the magnetic disk storage device according to claim 13.

* * * * *